(12) United States Patent
Harada et al.

(10) Patent No.: US 10,658,526 B2
(45) Date of Patent: May 19, 2020

(54) PHOTOVOLTAIC DEVICE

(71) Applicant: SHARP KABUSHIKI KAISHA, Sakai, Osaka (JP)

(72) Inventors: Masatomi Harada, Sakai (JP); Kenichi Higashi, Sakai (JP); Takeshi Kamikawa, Sakai (JP); Toshihiko Sakai, Sakai (JP); Tokuaki Kuniyoshi, Sakai (JP); Kazuya Tsujino, Sakai (JP); Liumin Zou, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 15/738,107

(22) PCT Filed: Feb. 24, 2016

(86) PCT No.: PCT/JP2016/055365
§ 371 (c)(1),
(2) Date: Dec. 19, 2017

(87) PCT Pub. No.: WO2016/208219
PCT Pub. Date: Dec. 29, 2016

(65) Prior Publication Data
US 2018/0190840 A1 Jul. 5, 2018

(30) Foreign Application Priority Data

Jun. 25, 2015 (JP) .................. 2015-127746

(51) Int. Cl.
*H01L 31/0224* (2006.01)
*H01L 31/0747* (2012.01)
(Continued)

(52) U.S. Cl.
CPC .. *H01L 31/0224* (2013.01); *H01L 31/022441* (2013.01); *H01L 31/03762* (2013.01); *H01L 31/03765* (2013.01); *H01L 31/0504* (2013.01); *H01L 31/0745* (2013.01); *H01L 31/0747* (2013.01); *Y02E 10/50* (2013.01)

(58) Field of Classification Search
None
See application file for complete search history.

(56) References Cited

U.S. PATENT DOCUMENTS

2011/0000532 A1 1/2011 Niira et al.
2011/0089420 A1 4/2011 Prabhakar
2015/0155828 A1 6/2015 Nam et al.

FOREIGN PATENT DOCUMENTS

JP 2010-283406 A 12/2010
JP 2015-108625 A 6/2015
WO 2009/096539 A1 8/2009

*Primary Examiner* — Shannon M Gardner
(74) *Attorney, Agent, or Firm* — ScienBiziP, P.C.

(57) ABSTRACT

In a photovoltaic device (1), first amorphous semiconductor portions (102*n*) and second amorphous semiconductor portions (102*p*) are provided alternately on one of faces of a semiconductor substrate (101). Each first amorphous semiconductor portion (102*n*) has at least one first amorphous semiconductor strip (1020*n*), and each second amorphous semiconductor portion (102*p*) has at least one second amorphous semiconductor strip (1020*p*). A plurality of first electrodes (103*n*) are provided spaced apart from each other on each first amorphous semiconductor strip (1020*n*), and a plurality of second electrodes (103*p*) are provided spaced apart from each other on each second amorphous semiconductor strip (1020*p*).

4 Claims, 30 Drawing Sheets

(51) Int. Cl.
*H01L 31/0376* (2006.01)
*H01L 31/0745* (2012.01)
*H01L 31/05* (2014.01)

(a)

(b)

(a)

(b)

PHOTOVOLTAIC DEVICE

TECHNICAL FIELD

The present invention relates to photovoltaic devices.

BACKGROUND ART

Japanese Unexamined Patent Application Publication, Tokukai, No. 2010-283406 discloses a backside-electrode-based solar cell including a monocrystal silicon substrate having formed on the backside thereof an amorphous silicon layer on which alternate n- and p-type amorphous semiconductor strips are formed using metal masks. Electrodes are then formed on the n- and p-type amorphous semiconductor strips using metal masks.

SUMMARY OF INVENTION

In Japanese Unexamined Patent Application Publication, Tokukai, No. 2010-283406, if the silicon substrate is reduced in thickness, the silicon substrate is progressively more likely to warp or bend under the stress of these p-type amorphous semiconductor strips, n-type amorphous semiconductor strips, and electrodes when they are formed on the silicon substrate. The electrodes in particular produce heavy stress, thereby affecting the silicon substrate more than the p- and n-type amorphous semiconductor strips do.

It is an object of the present invention to provide a photovoltaic device that, even when fabricated on a semiconductor substrate with a reduced thickness, still lowers the stress produced by the electrodes, thereby restraining the semiconductor substrate from warping and bending.

The present invention is directed to a photovoltaic device including: a semiconductor substrate; a first amorphous semiconductor portion on one of faces of the semiconductor substrate, the first amorphous semiconductor portion including at least one first amorphous semiconductor strip of a first conductivity type; a second amorphous semiconductor portion on that face of the semiconductor substrate, adjacent in an in-plane direction of the semiconductor substrate to the first amorphous semiconductor portion, the second amorphous semiconductor portion including at least one second amorphous semiconductor strip of a second conductivity type that differs from the first conductivity type; a plurality of first electrodes spaced apart from each other in the first amorphous semiconductor portion; and a plurality of second electrodes spaced apart from each other in the second amorphous semiconductor portion, wherein the first electrodes are provided on the at least one first amorphous semiconductor strip, and the second electrodes are provided on the at least one second amorphous semiconductor strip.

The present invention, even when the semiconductor substrate has a reduced thickness, lowers the stress produced by the electrodes, thereby restraining the semiconductor substrate from warping and bending.

Figure 3A:
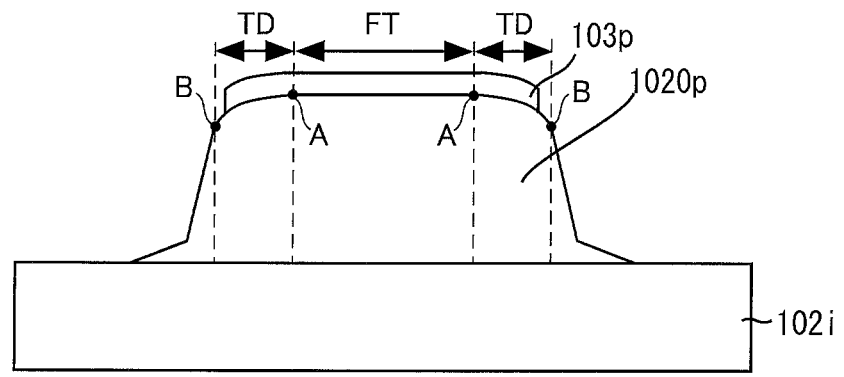
FIG. 3A is a schematic diagram representing an exemplary cross-sectional structure of a p-type amorphous semiconductor strip.
Figure 3B:
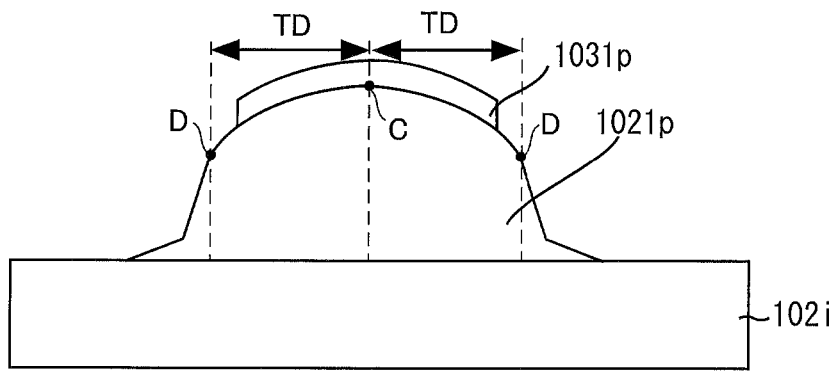
FIG. 3B is a schematic diagram representing another exemplary cross-sectional structure of the p-type amorphous semiconductor strip.
Figure 3C:
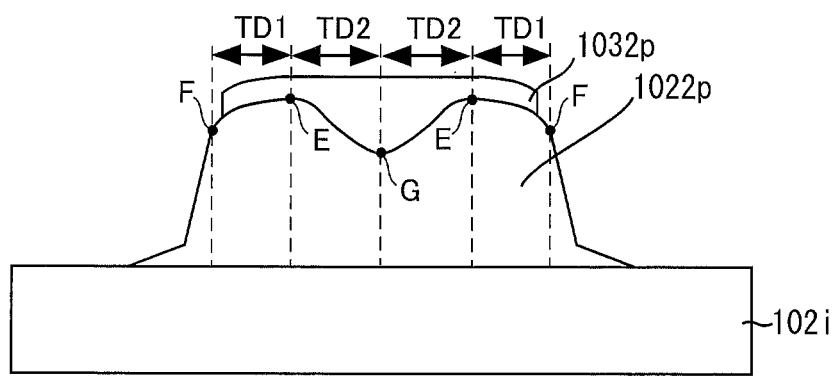
FIG. 3C is a schematic diagram representing a further exemplary cross-sectional structure of the p-type amorphous semiconductor strip.
Figure 3D:
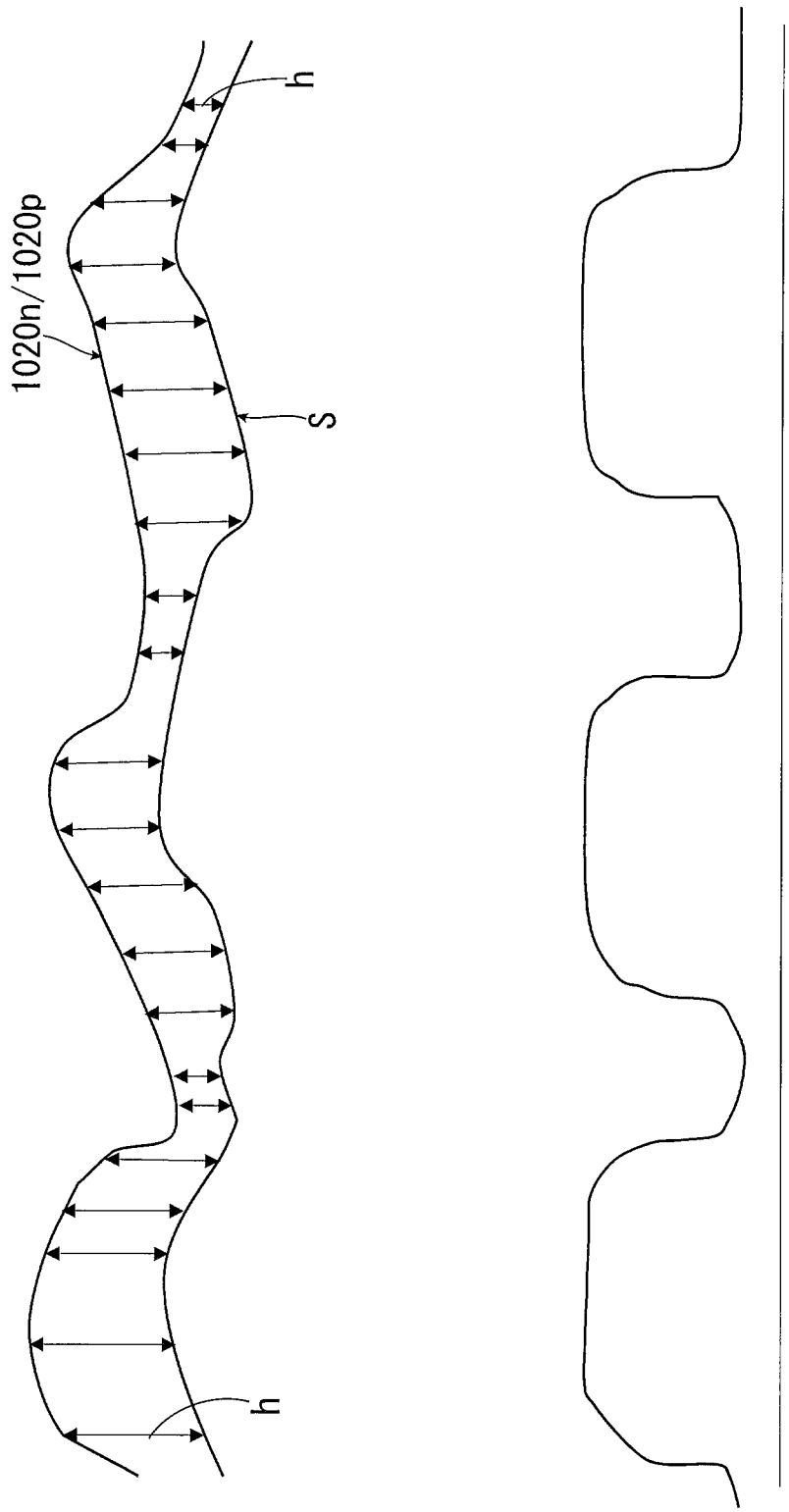

Portion (a) of FIG. 3D is a schematic diagram representing results of measurement of a distance (thickness) from the interface between an i-type amorphous semiconductor layer and the surface of a silicon substrate to the surface of an amorphous semiconductor layer, and (b) of FIG. 3D is a schematic diagram representing results of re-plotting of the film thickness measurements shown in (a) of FIG. 3D.

Figure 4:
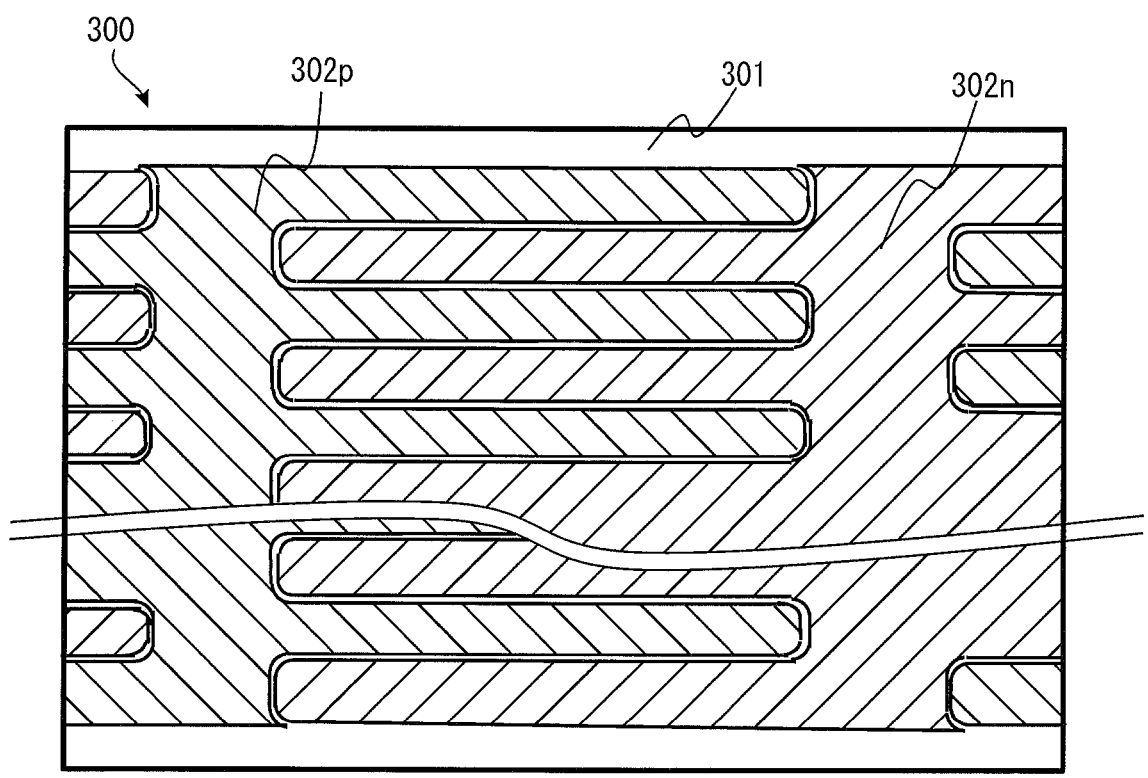

FIG. 4 is a schematic plan view of a wiring sheet in accordance with the first embodiment.

Figure 5A:
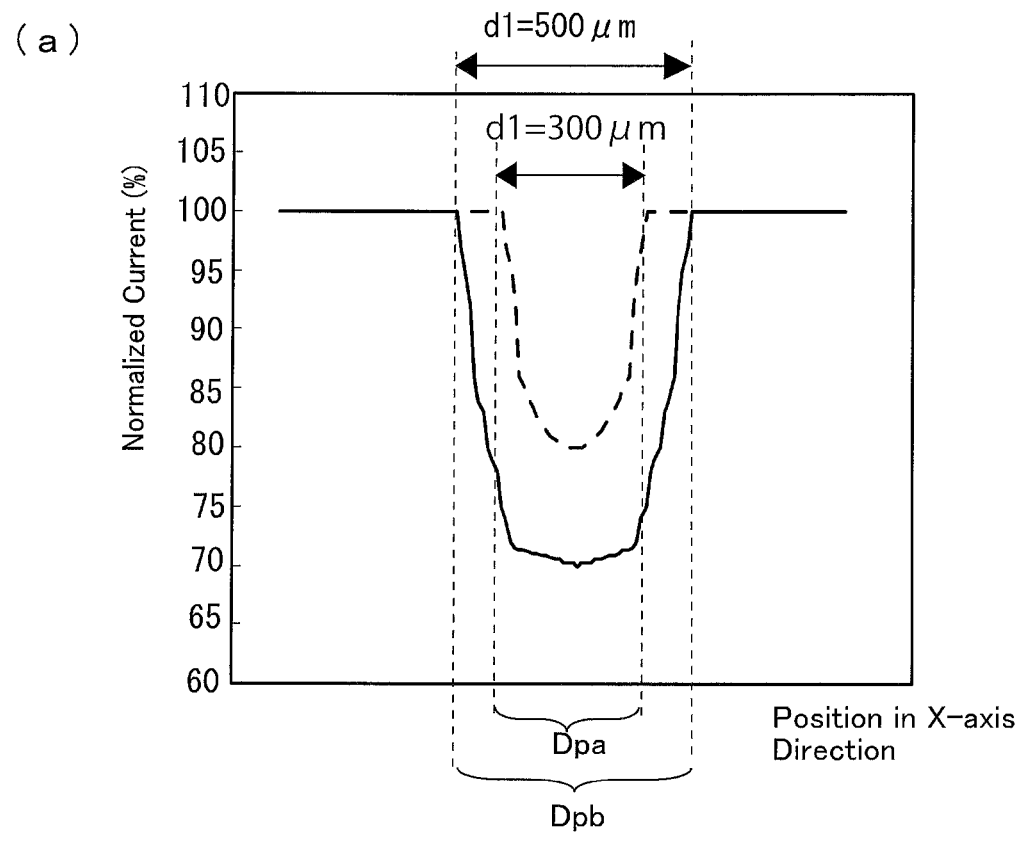
Figure 5A:
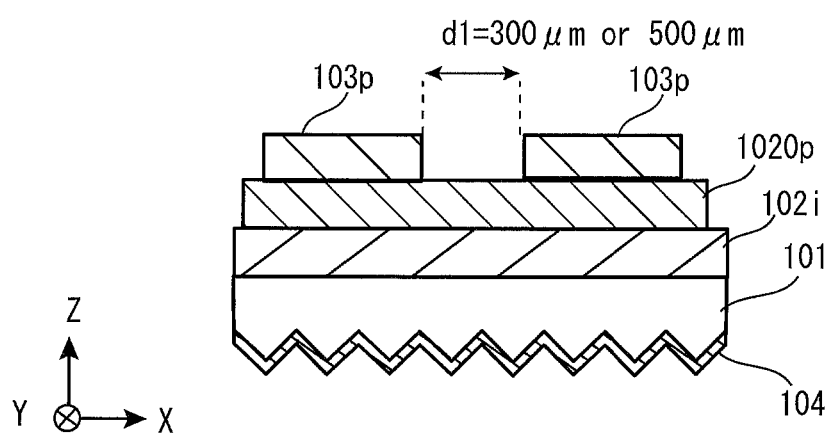

Portion (a) of FIG. 5A is a diagram representing results of measurement of electric current produced by projecting a laser beam onto a photovoltaic device having p-type-electrode-to-p-type-electrode distances d1 of 300 μm and 500 μm, and (b) of FIG. 5A is a cross-sectional view of the photovoltaic device on which measurement is made for (a) of FIG. 5A.

Figure 5B:
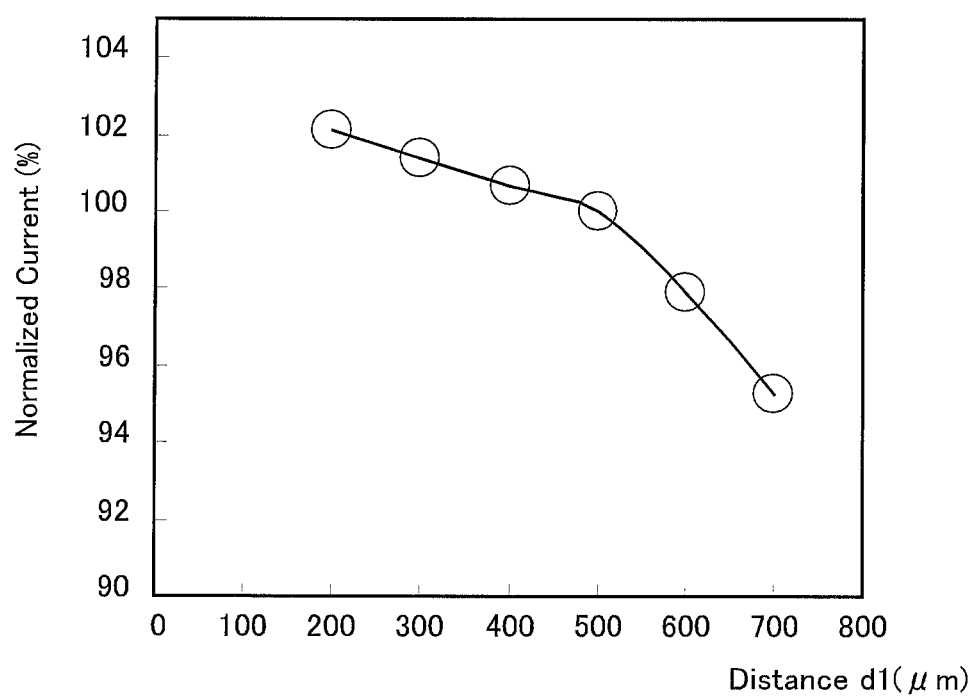

FIG. 5B is a diagram representing results of measurement of electric current produced by projecting a laser beam onto photovoltaic devices having various distances d1 of from 200 μm to 700 μm.

Figure 1:
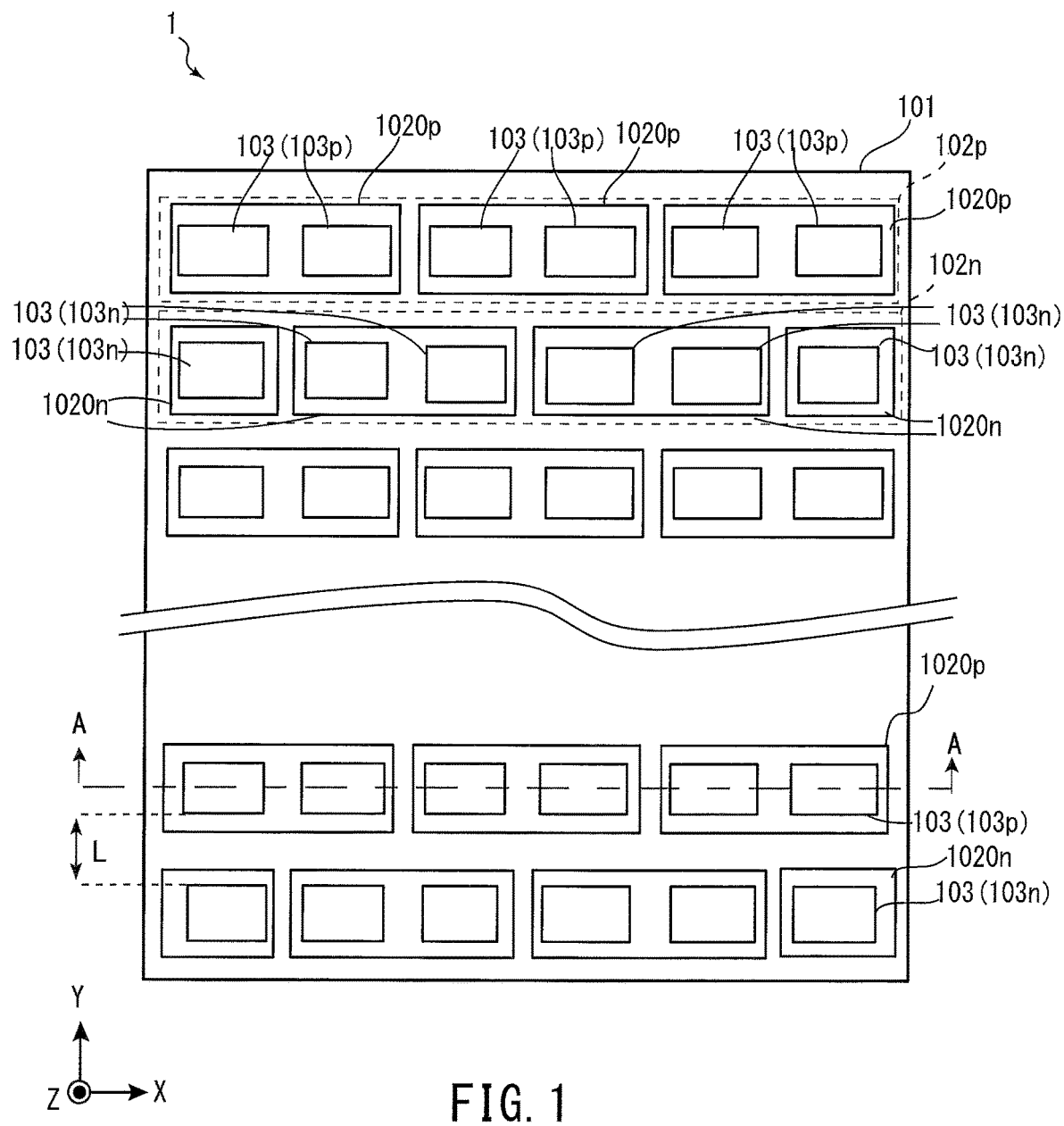
FIG. 1 is a schematic plan view of a photovoltaic device in accordance with a first embodiment.
Figure 6A:

FIG. 6A is a cross-sectional view illustrating a step of manufacturing the photovoltaic device shown in FIG. 1 where a texture has been formed on a silicon substrate.

Figure 6B:
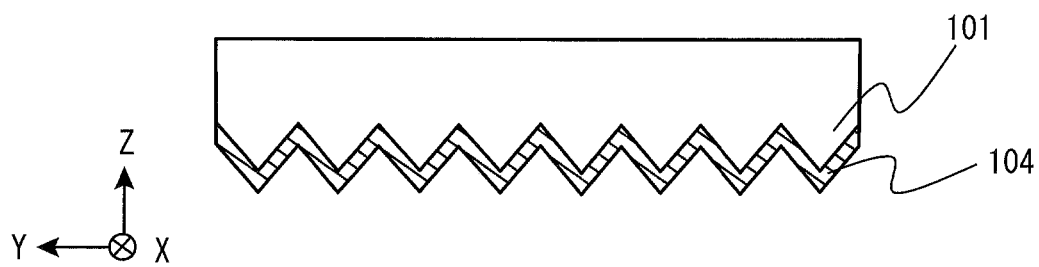

FIG. 6B is a cross-sectional view where an antireflective film has been formed on a light-receiving face of the silicon substrate shown in FIG. 6A.

Figure 6C:
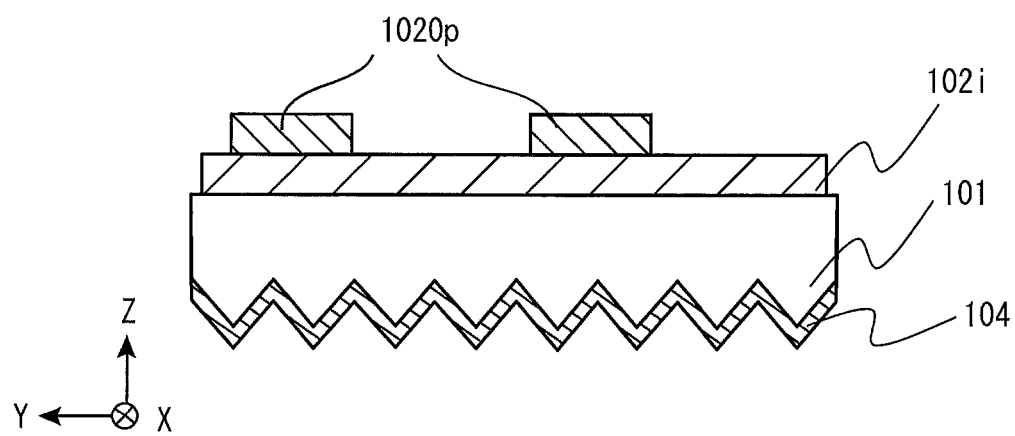

FIG. 6C is a cross-sectional view where an i-type amorphous semiconductor layer and p-type amorphous semiconductor strips have been formed on the back face of the silicon substrate shown in FIG. 6B.

Figure 6D:
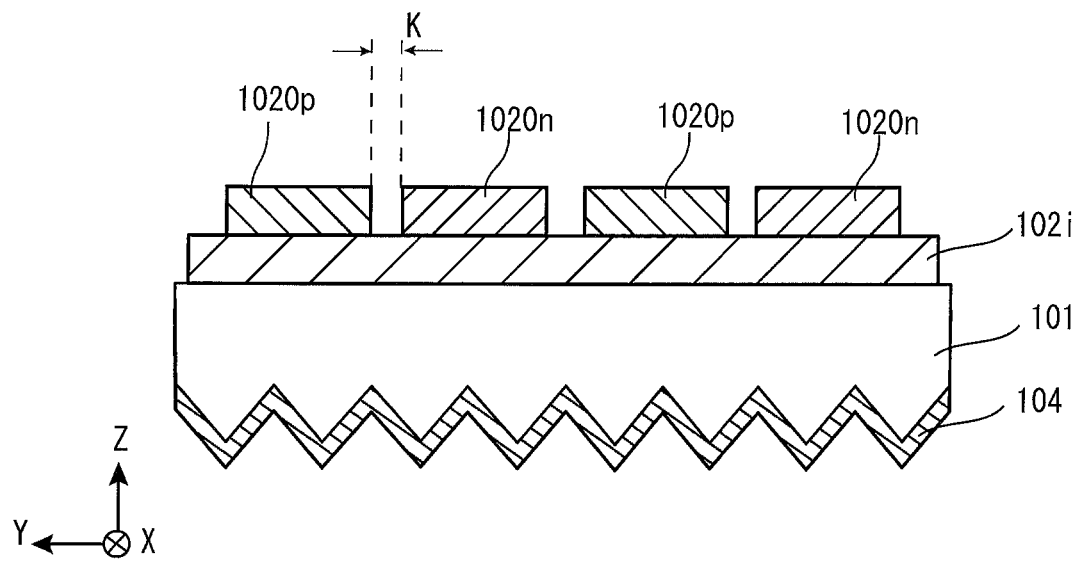

FIG. 6D is a cross-sectional view where n-type amorphous semiconductor strips have been formed on the back face of the silicon substrate shown in FIG. 6C.

Figure 6E:
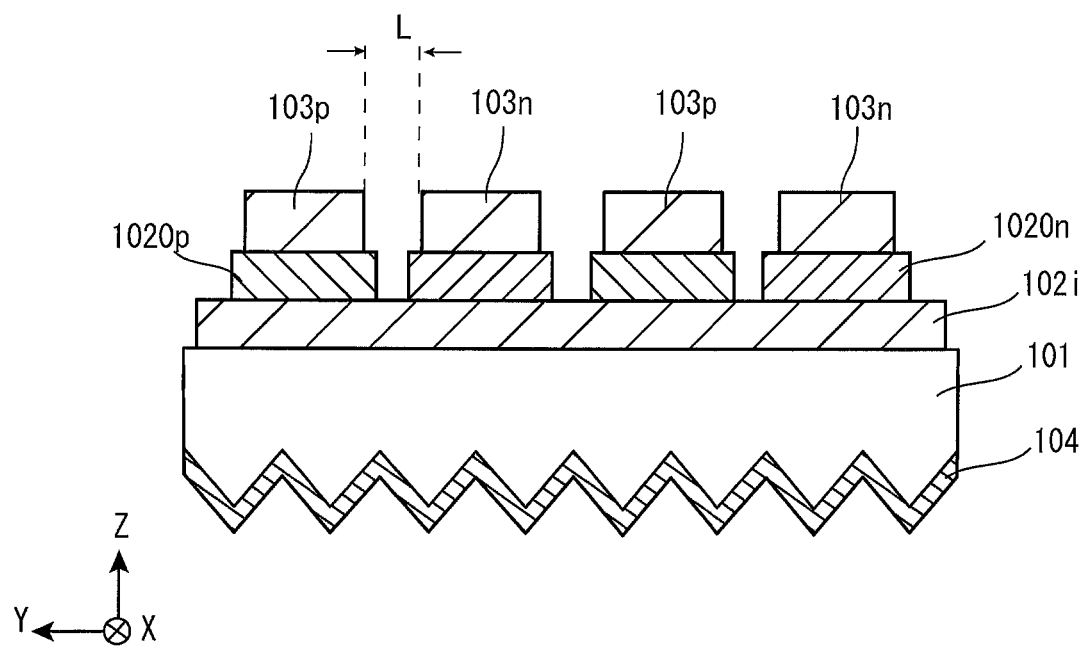

FIG. 6E is a cross-sectional view where electrodes have been formed on the p-type amorphous semiconductor strips and the n-type amorphous semiconductor strips shown in FIG. 6D.

Figure 7:
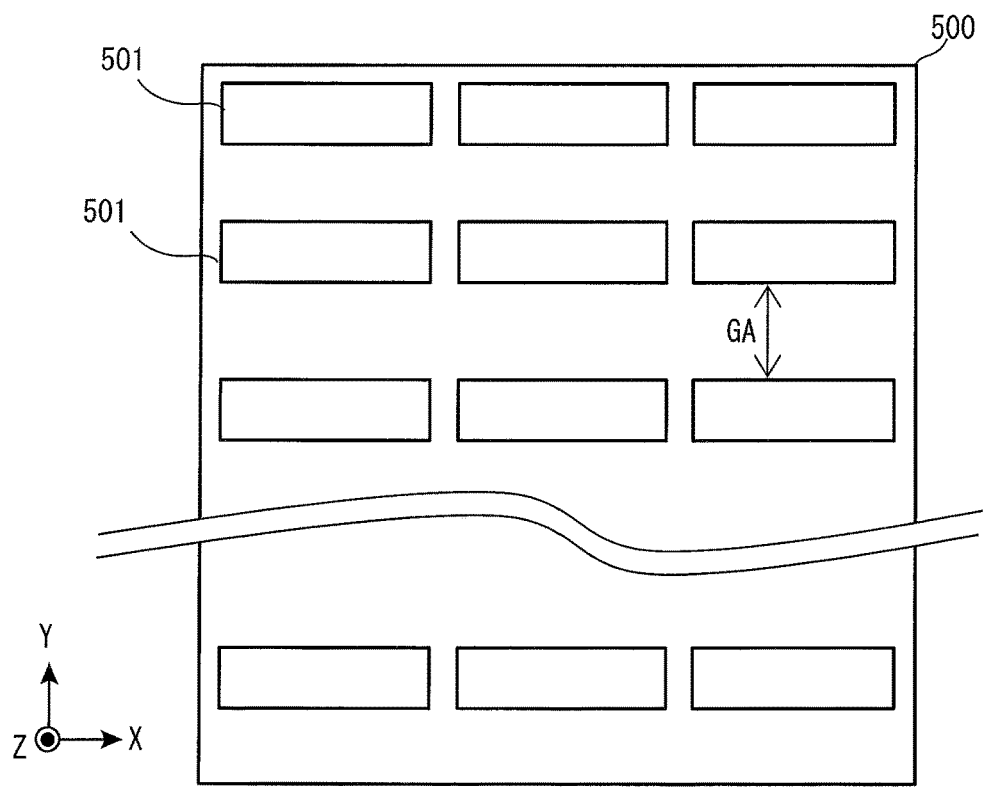

FIG. 7 is a schematic plan view of a metal mask used to form the p-type amorphous semiconductor strips in the step depicted in FIG. 6C.

Figure 8:
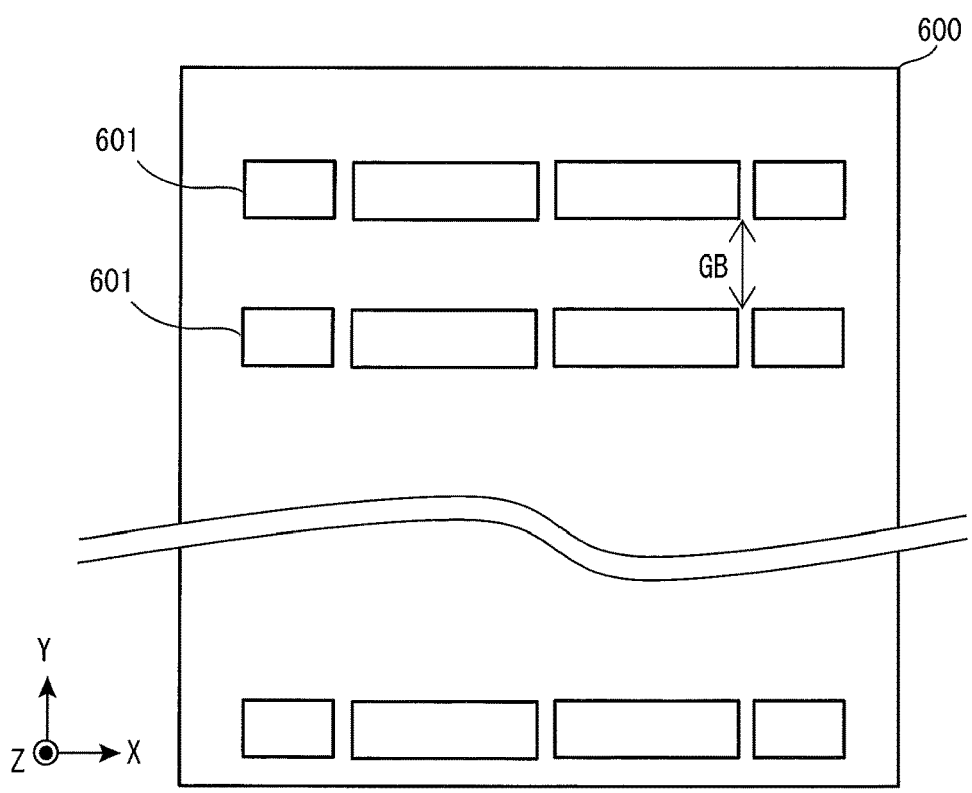

FIG. 8 is a schematic plan view of a metal mask used to form the n-type amorphous semiconductor strips in the step depicted in FIG. 6D.

Figure 9:
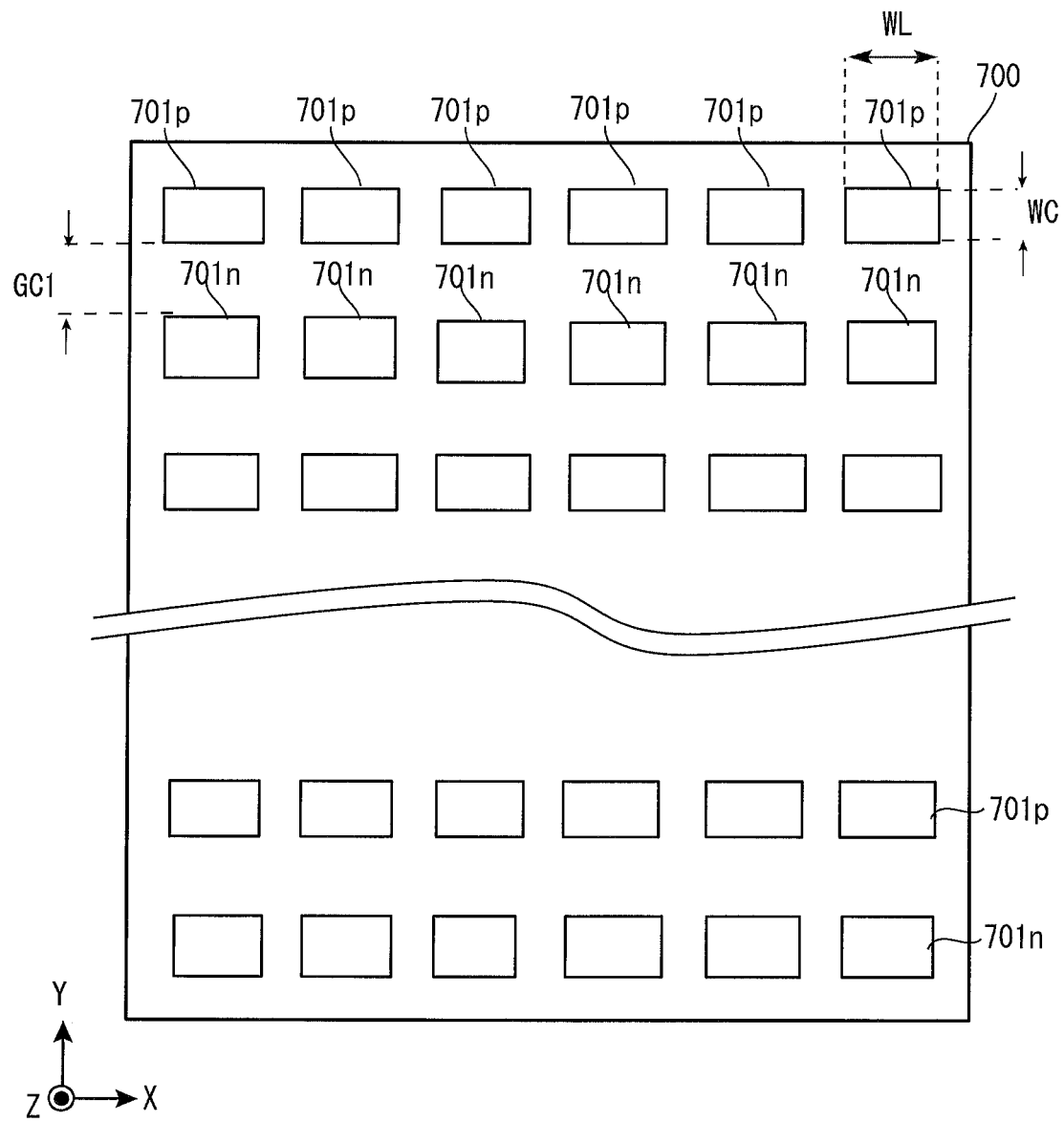

FIG. 9 is a schematic plan view of a metal mask used to form the electrodes in the step depicted in FIG. 6E.

Figure 10A:
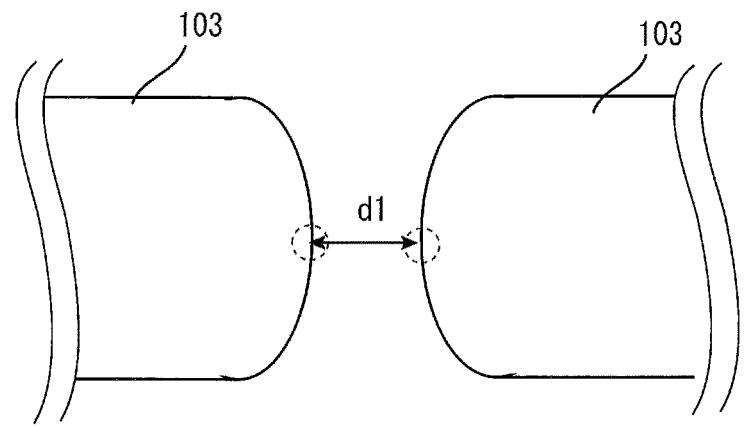

FIG. 10A is a schematic diagram representing an exemplary shape of end regions of electrodes formed using a metal mask.

Figure 10B:
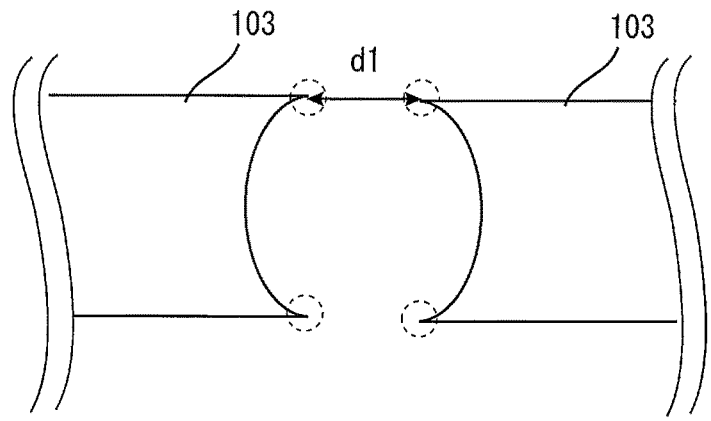

FIG. 10B is a schematic diagram representing an exemplary shape of end regions of electrodes formed using a metal mask.

Figure 10C:
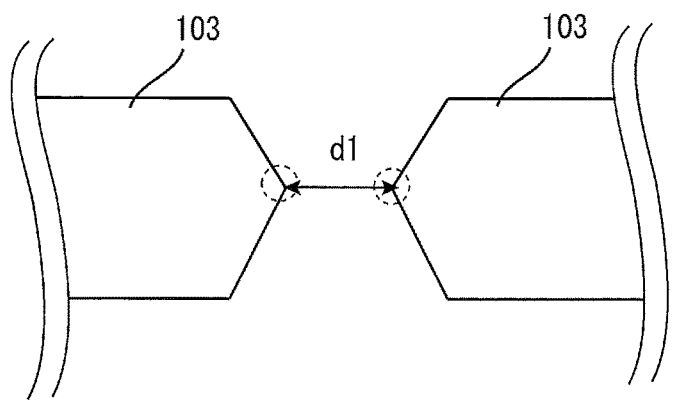

FIG. 10C is a schematic diagram representing an exemplary shape of end regions of electrodes formed using a metal mask.

Figure 11:
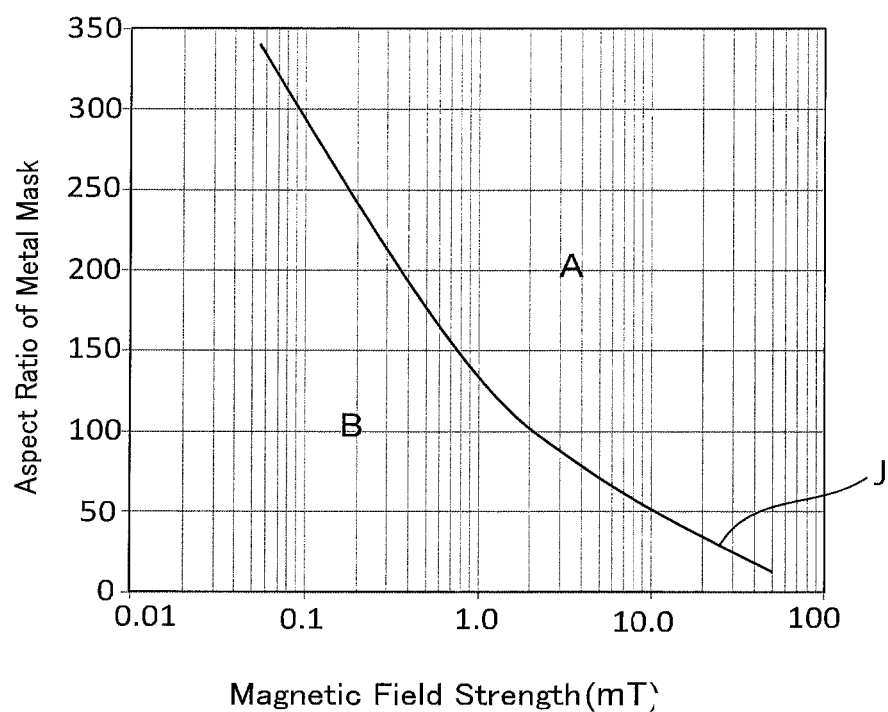

FIG. 11 is a diagram representing a relationship between a magnetic field and the aspect ratio of a metal mask that can be placed on a silicon substrate with a predetermined level of precision.

Figure 12A:
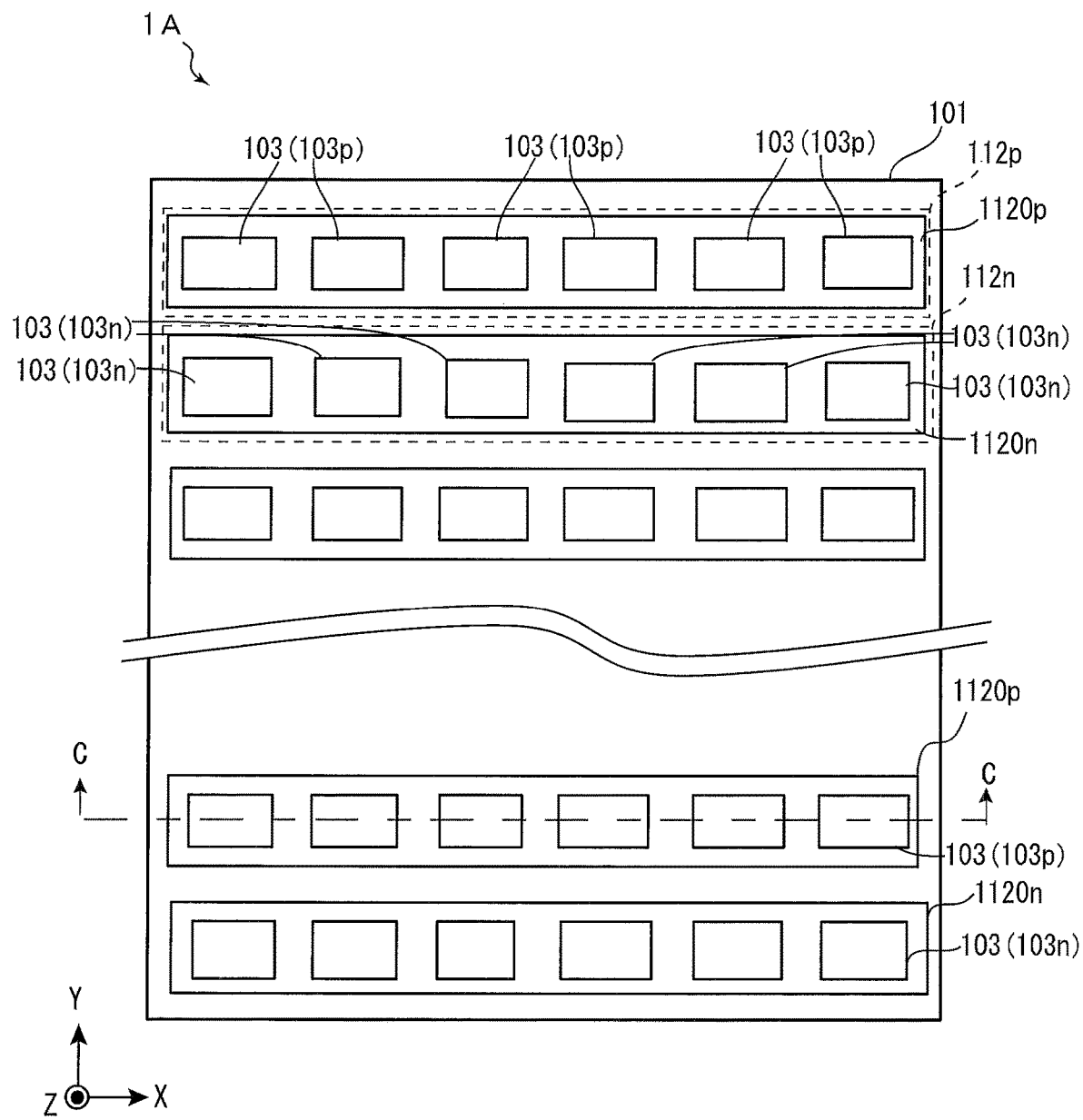

FIG. 12A is a schematic plan view of a photovoltaic device in accordance with a second embodiment.

Figure 12B:
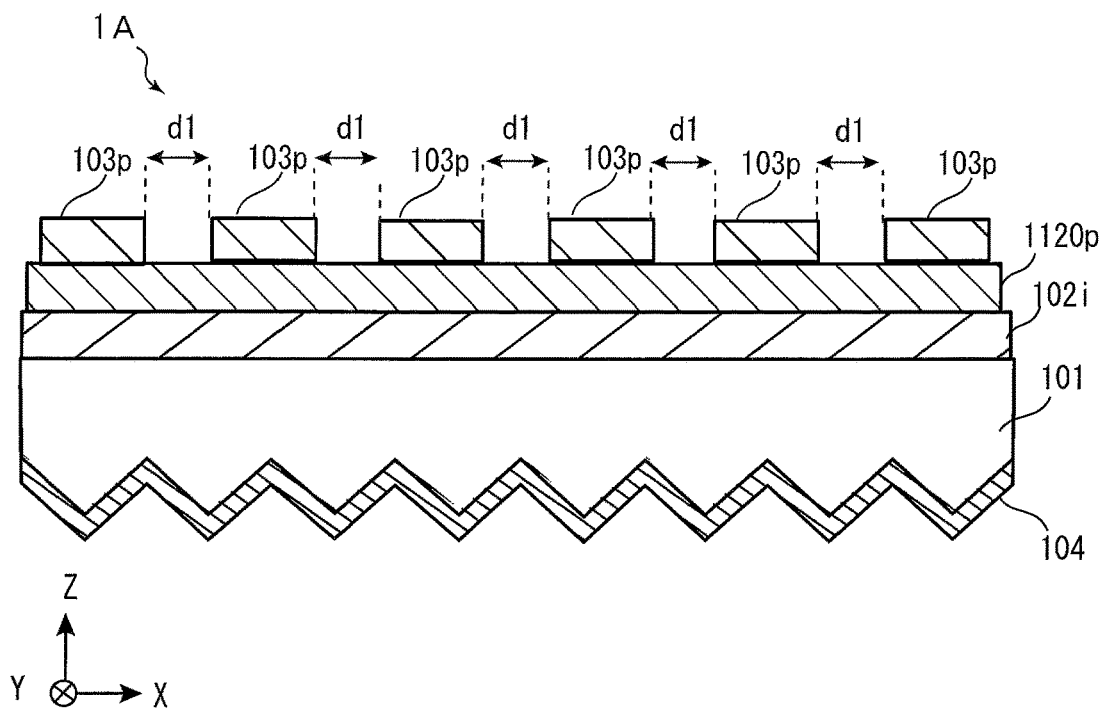

FIG. 12B is a schematic C-C cross-sectional view of the photovoltaic device shown in FIG. 12A.

Figure 13A:
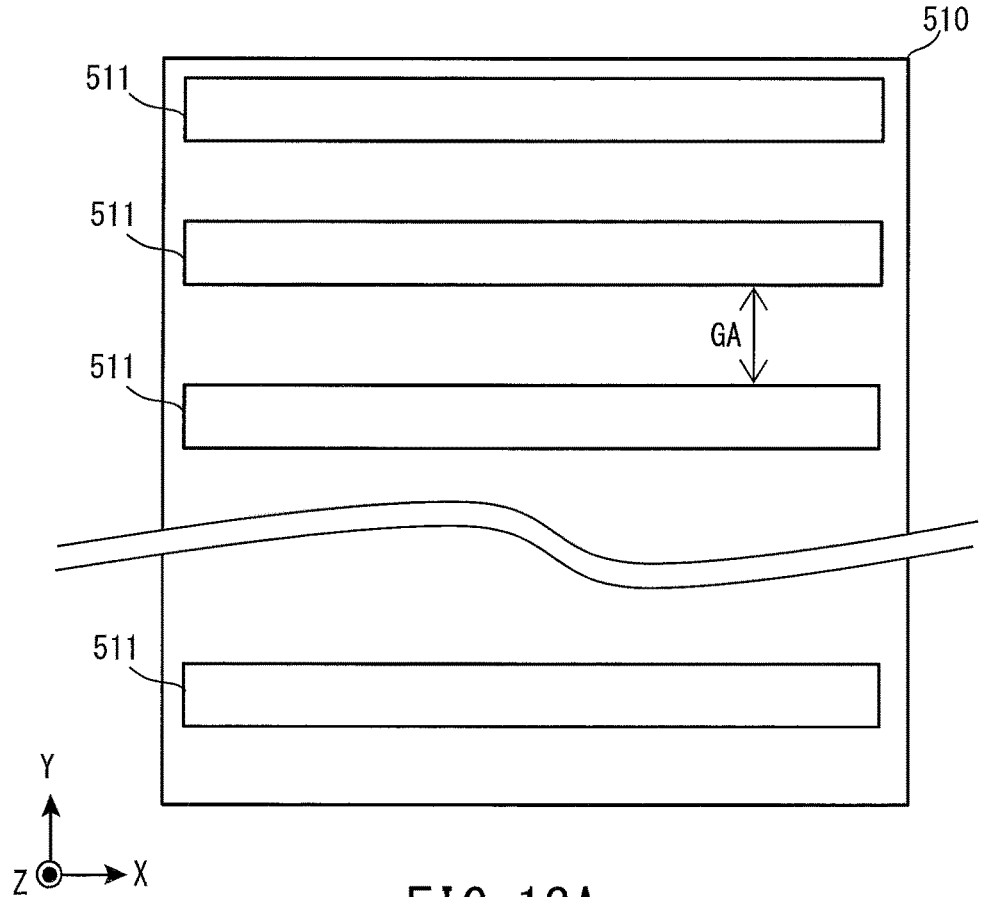

FIG. 13A is a schematic plan view of a metal mask used to form p-type amorphous semiconductor strips in the photovoltaic device shown in FIG. 12A.

Figure 13B:
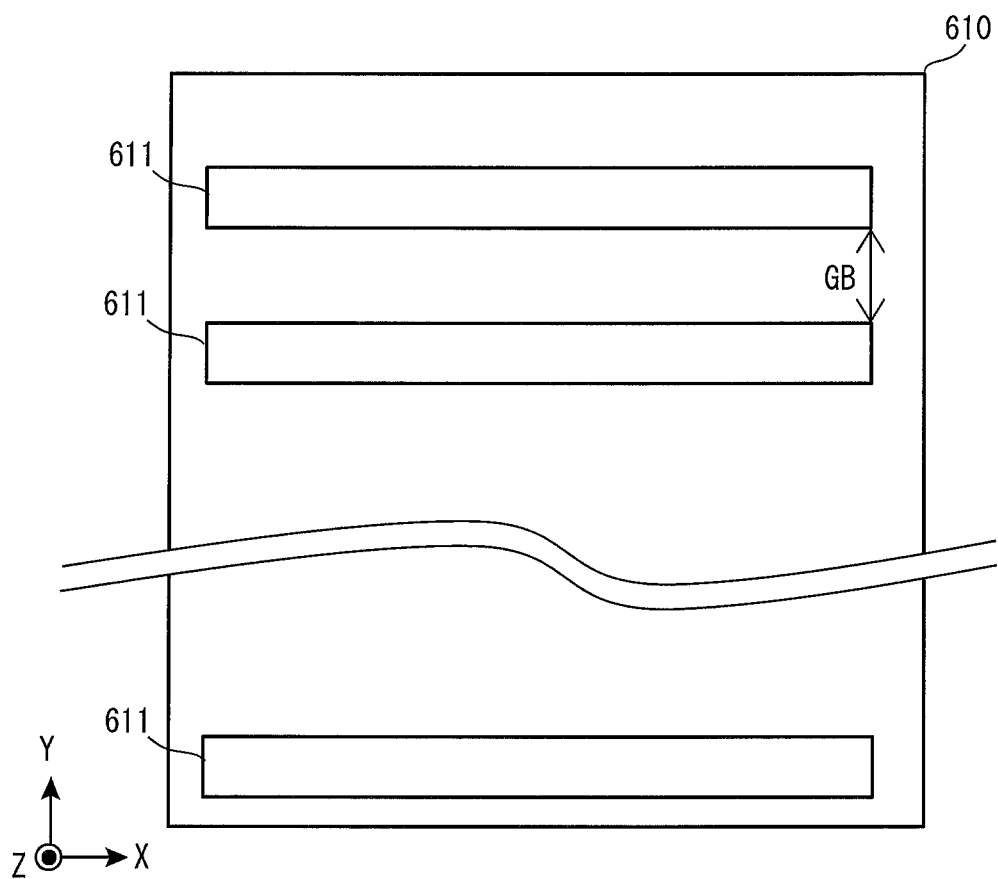

FIG. 13B is a schematic plan view of a metal mask used to form n-type amorphous semiconductor strips in the photovoltaic device shown in FIG. 12A.

Figure 14A:
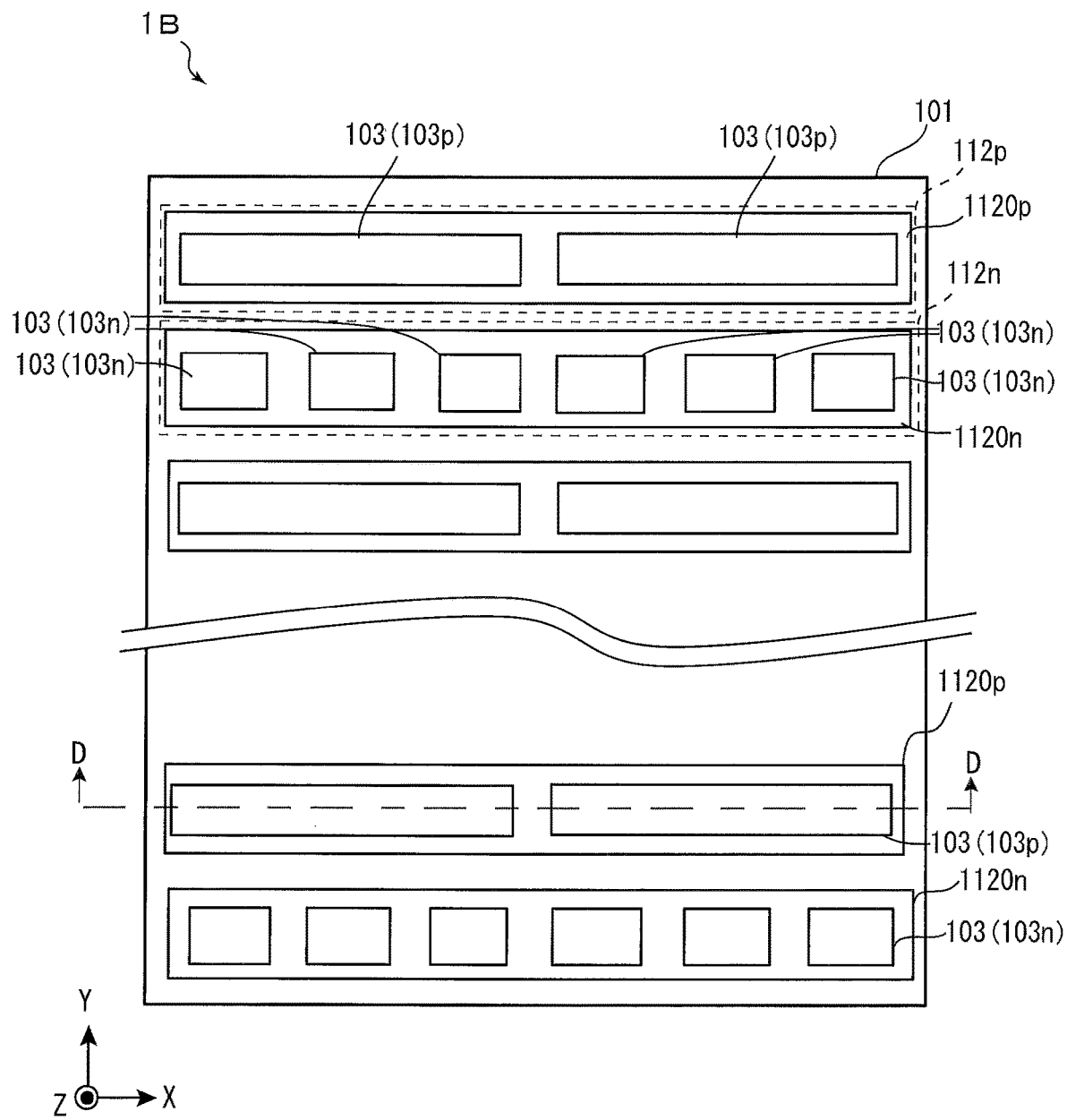

FIG. 14A is a schematic plan view of a photovoltaic device in accordance with a third embodiment.

Figure 14B:
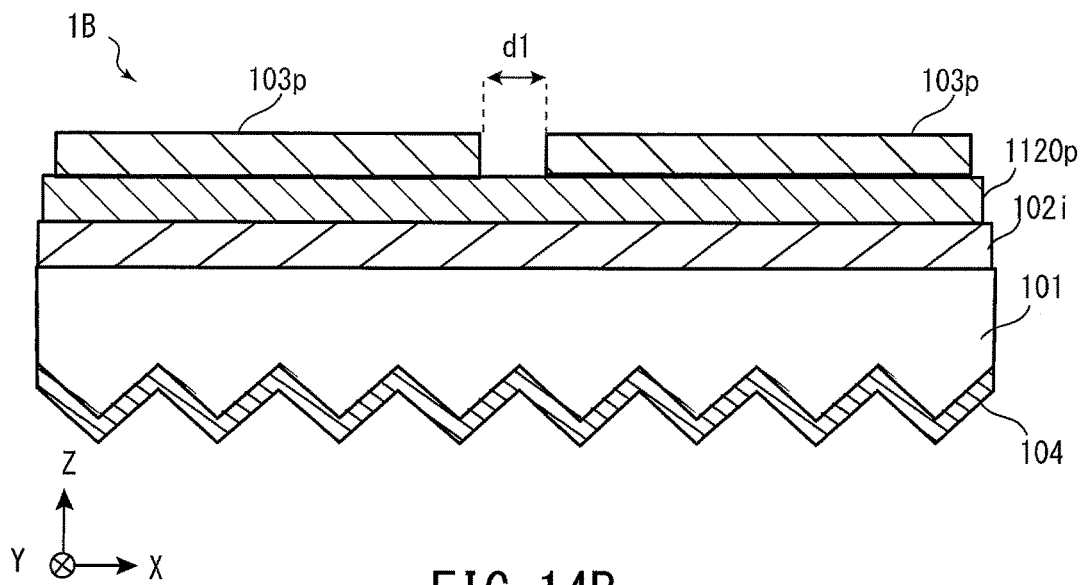

FIG. 14B is a schematic D-D cross-sectional view of the photovoltaic device shown in FIG. 14A.

Figure 15:
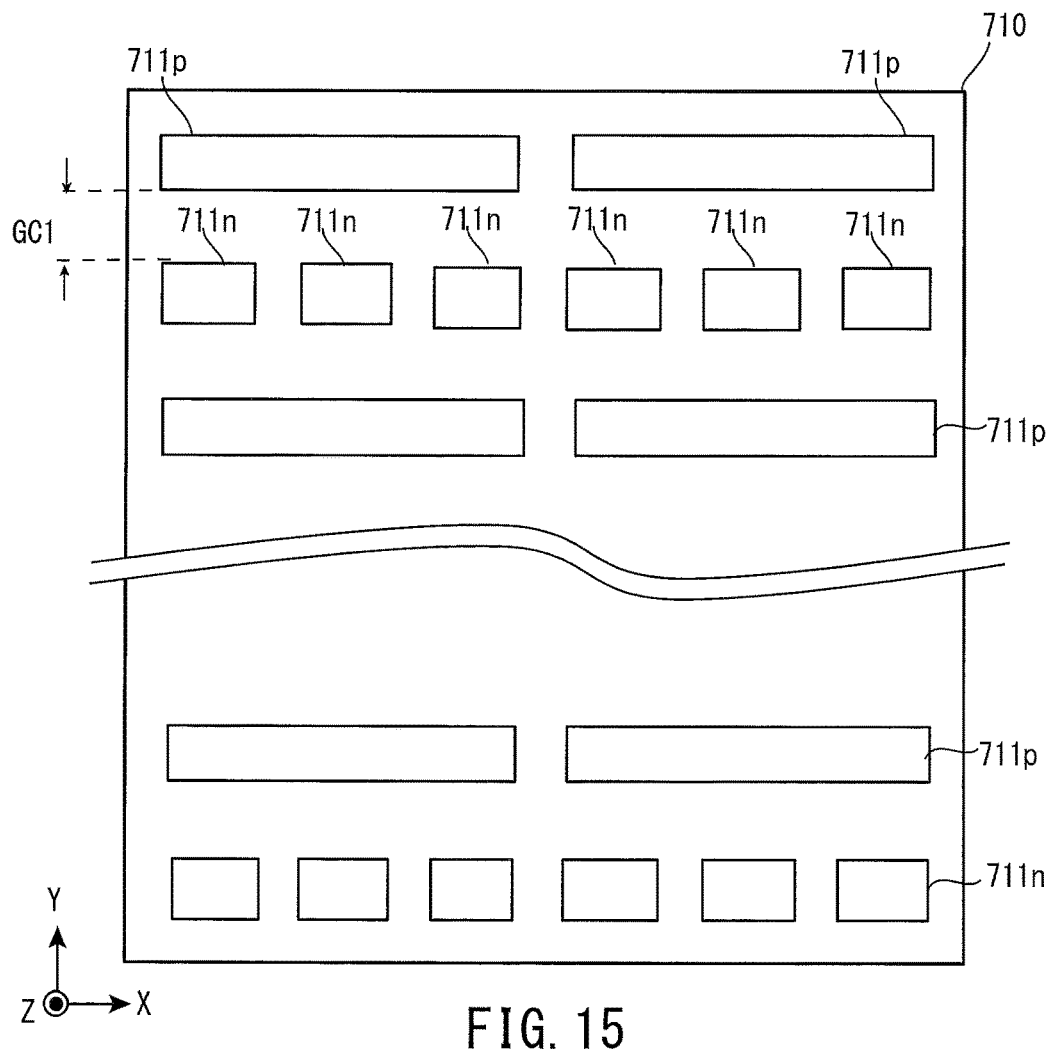

FIG. 15 is a schematic plan view of a metal mask used to form electrodes in the photovoltaic device shown in FIG. 14A.

Figure 16A:
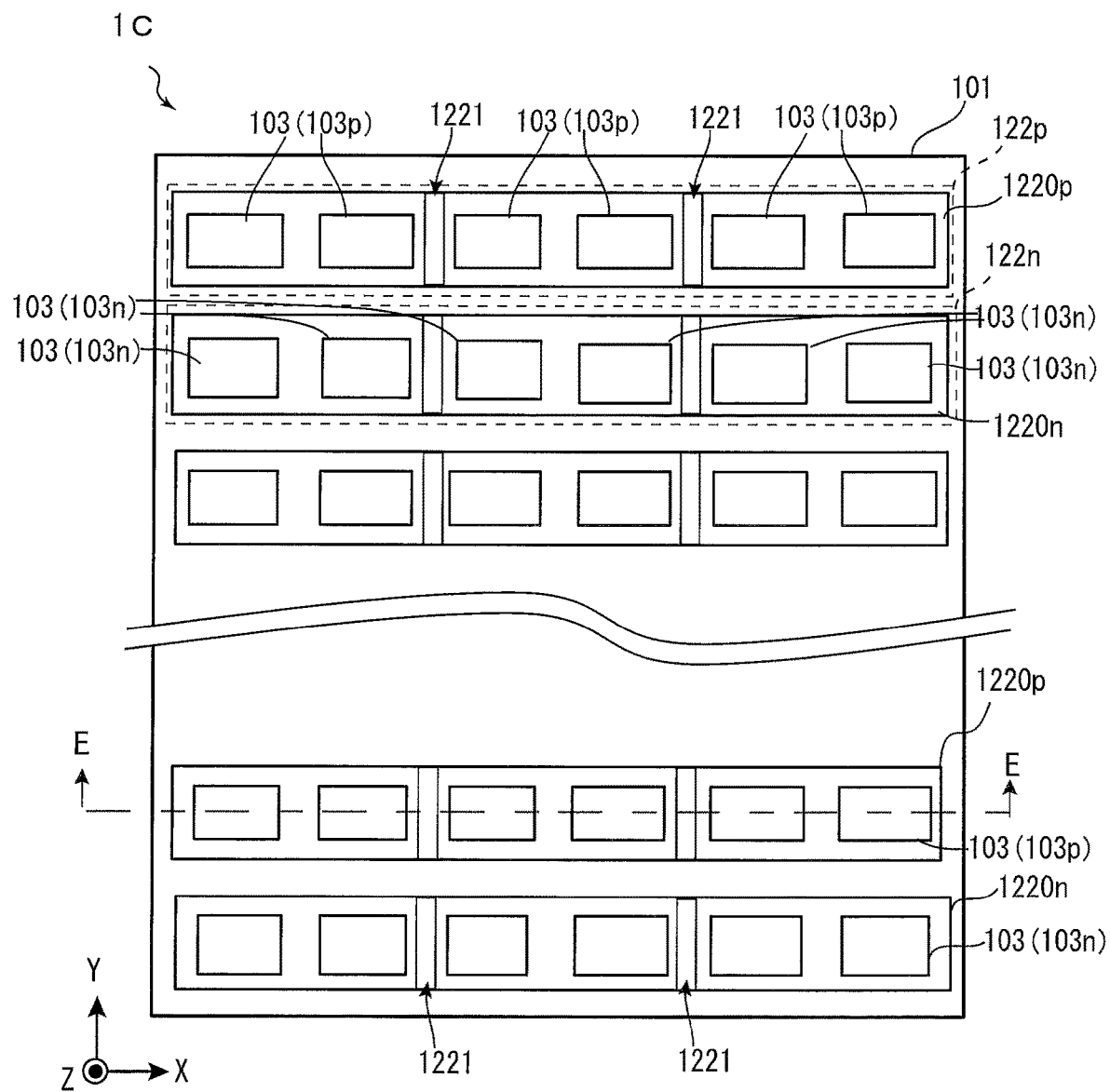

FIG. 16A is a schematic plan view of a photovoltaic device in accordance with a fourth embodiment.

Figure 16B:
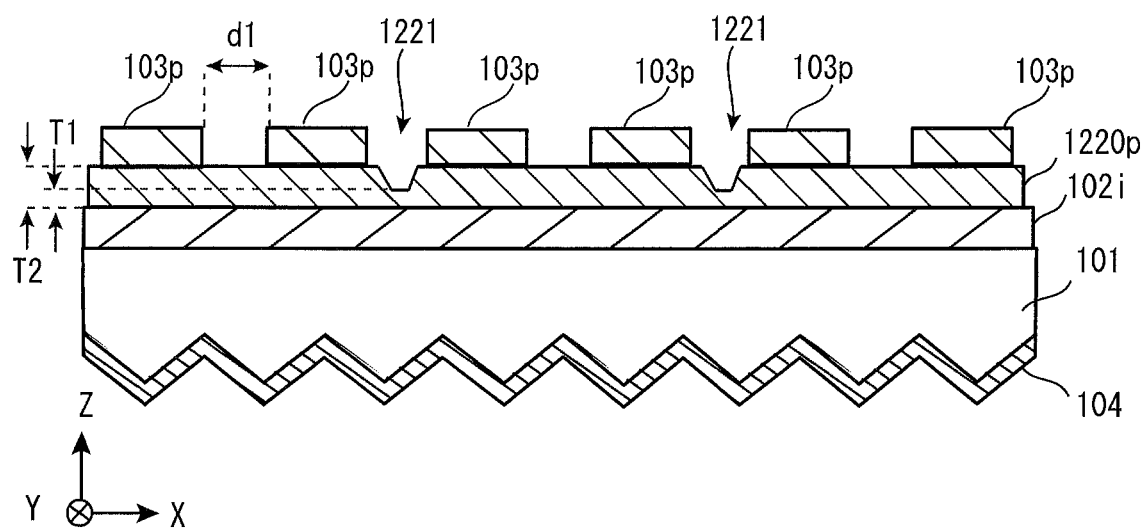

FIG. 16B is a schematic E-E cross-sectional view of the photovoltaic device shown in FIG. 16A.

Figure 17:
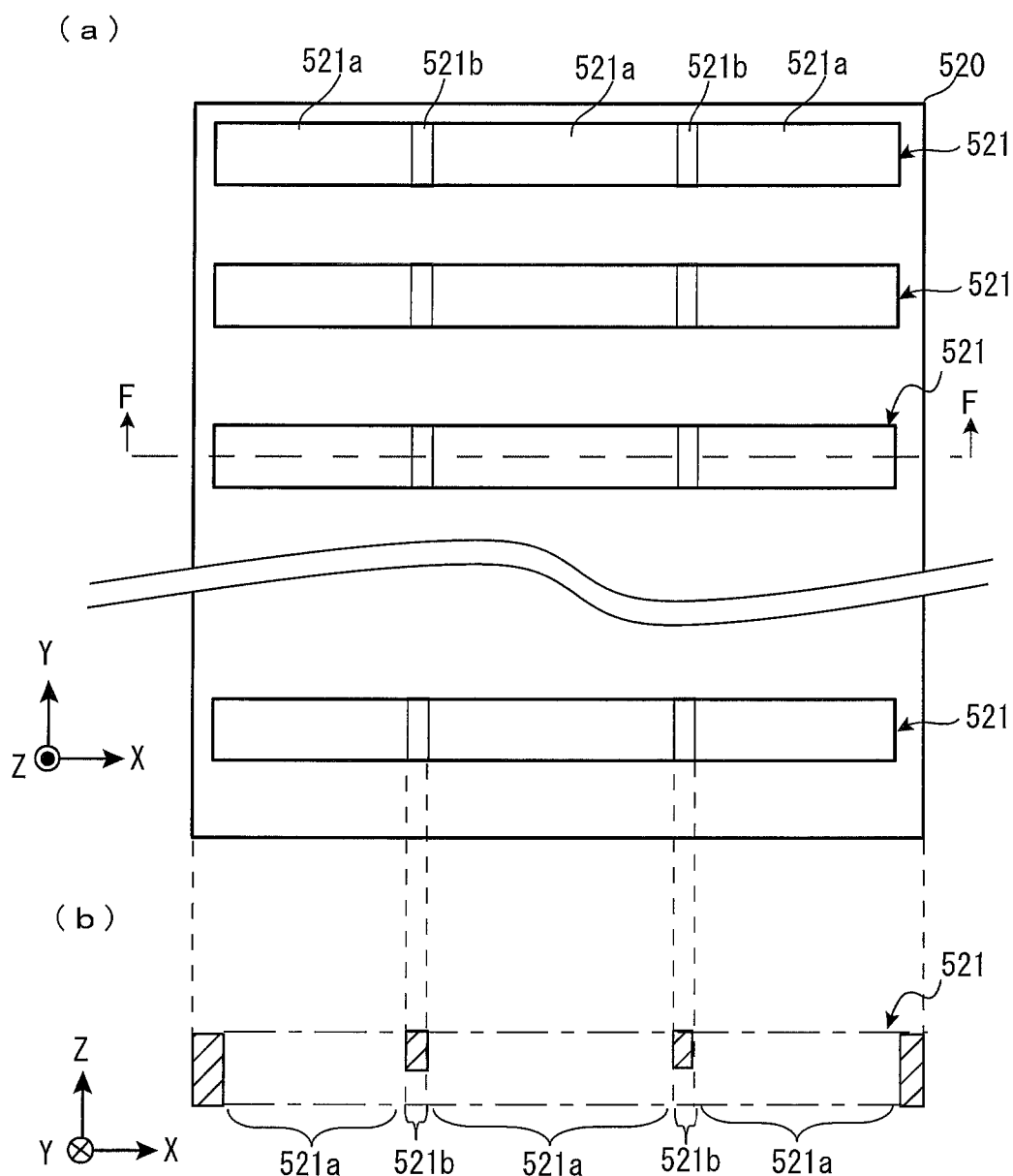

Portion (a) of FIG. 17 is a schematic plan view of a metal mask used to form p-type amorphous semiconductor strips in the photovoltaic device shown in FIG. 16A, and (b) of FIG. 17 is a schematic F-F cross-sectional view of the metal mask shown in (a) of FIG. 17.

Figure 18A:
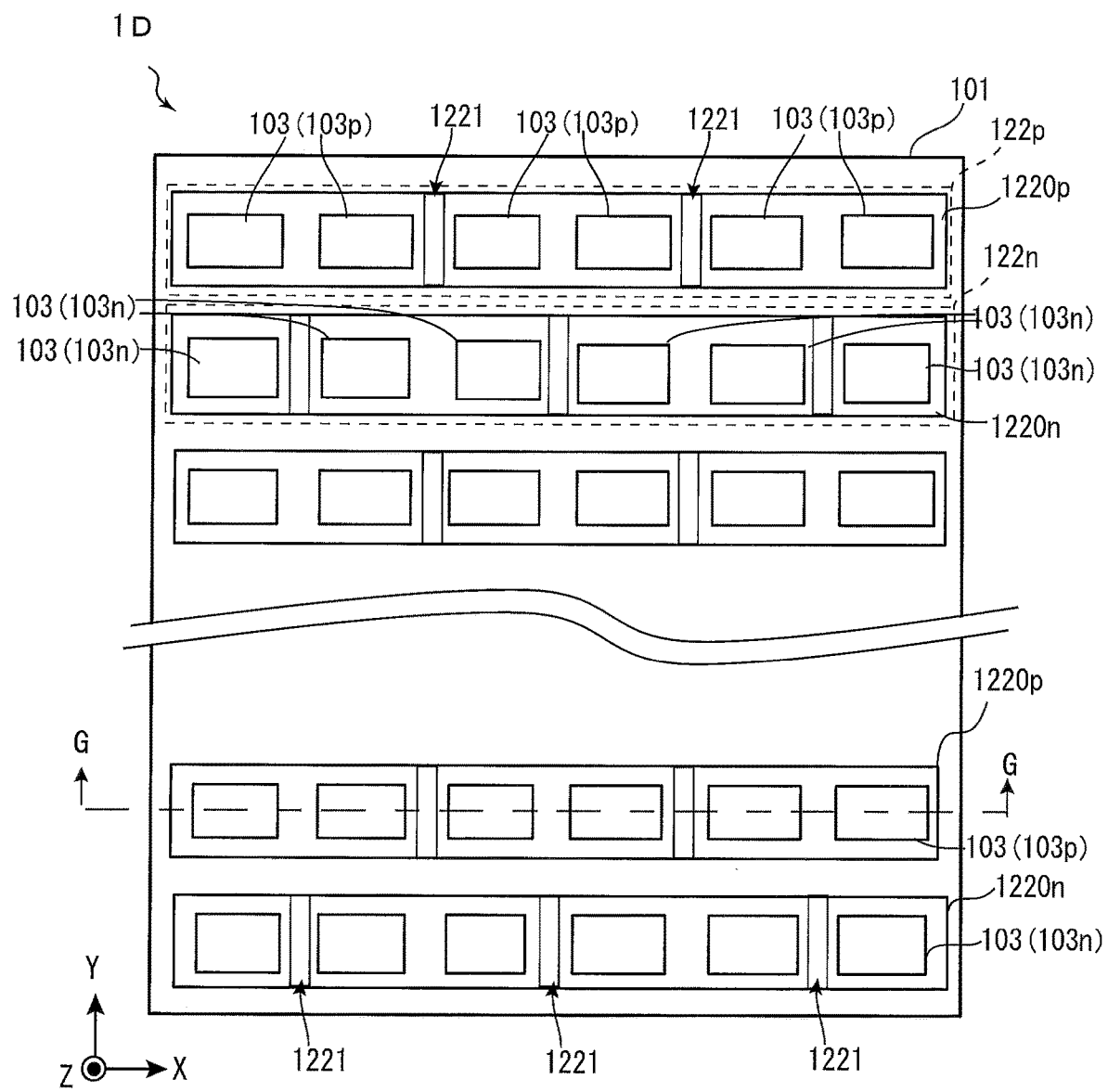

FIG. 18A is a schematic plan view of a photovoltaic device in accordance with a fifth embodiment.

Figure 18B:
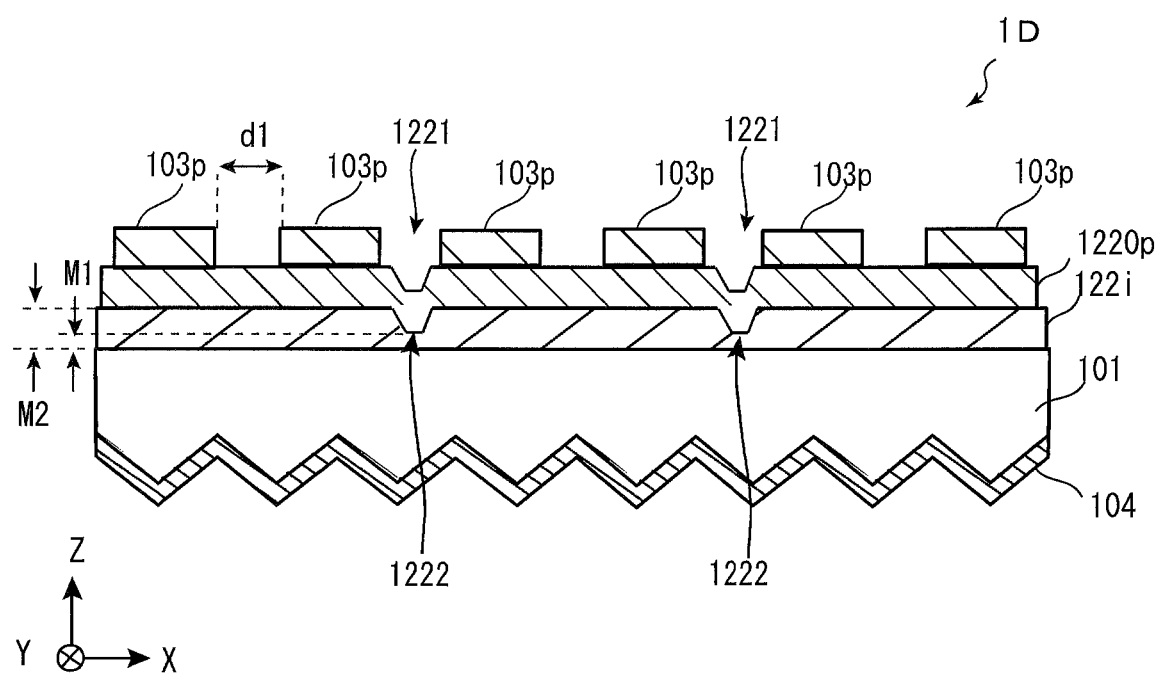

FIG. 18B is a schematic G-G cross-sectional view of the photovoltaic device shown in FIG. 18A.

Figure 19:
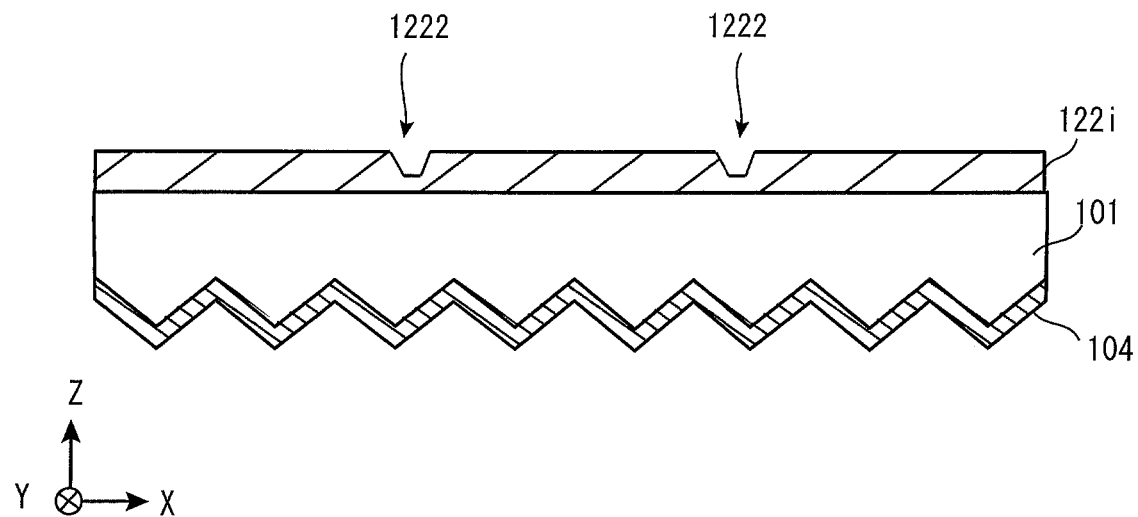

FIG. 19 is a cross-sectional view where an i-type amorphous semiconductor layer has been formed on the back face of a silicon substrate.

Figure 20:
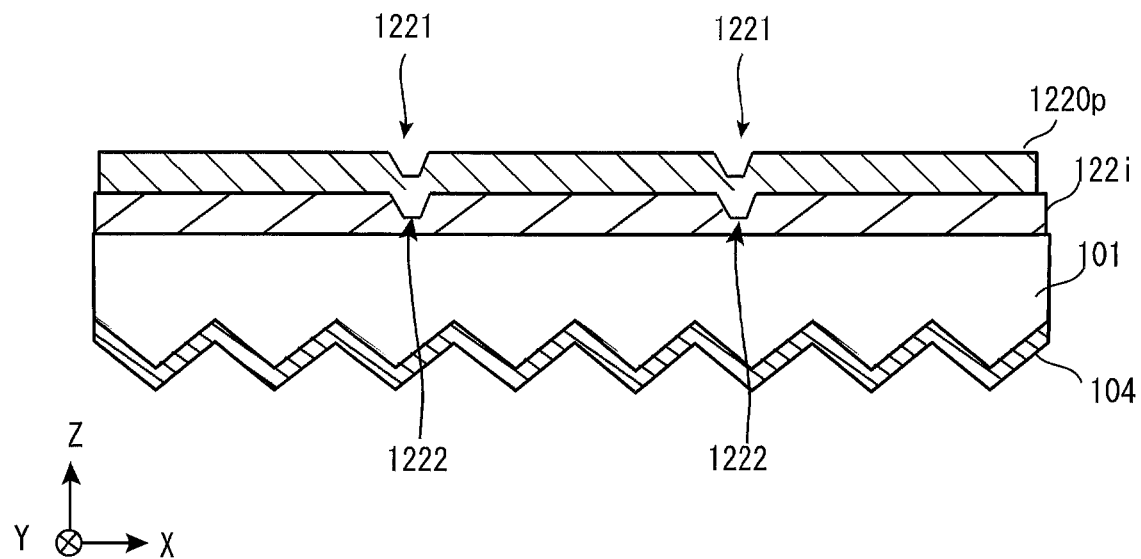

FIG. 20 is a cross-sectional view of a p-type amorphous semiconductor strip formed on the i-type amorphous semiconductor layer shown in FIG. 19.

Figure 21:
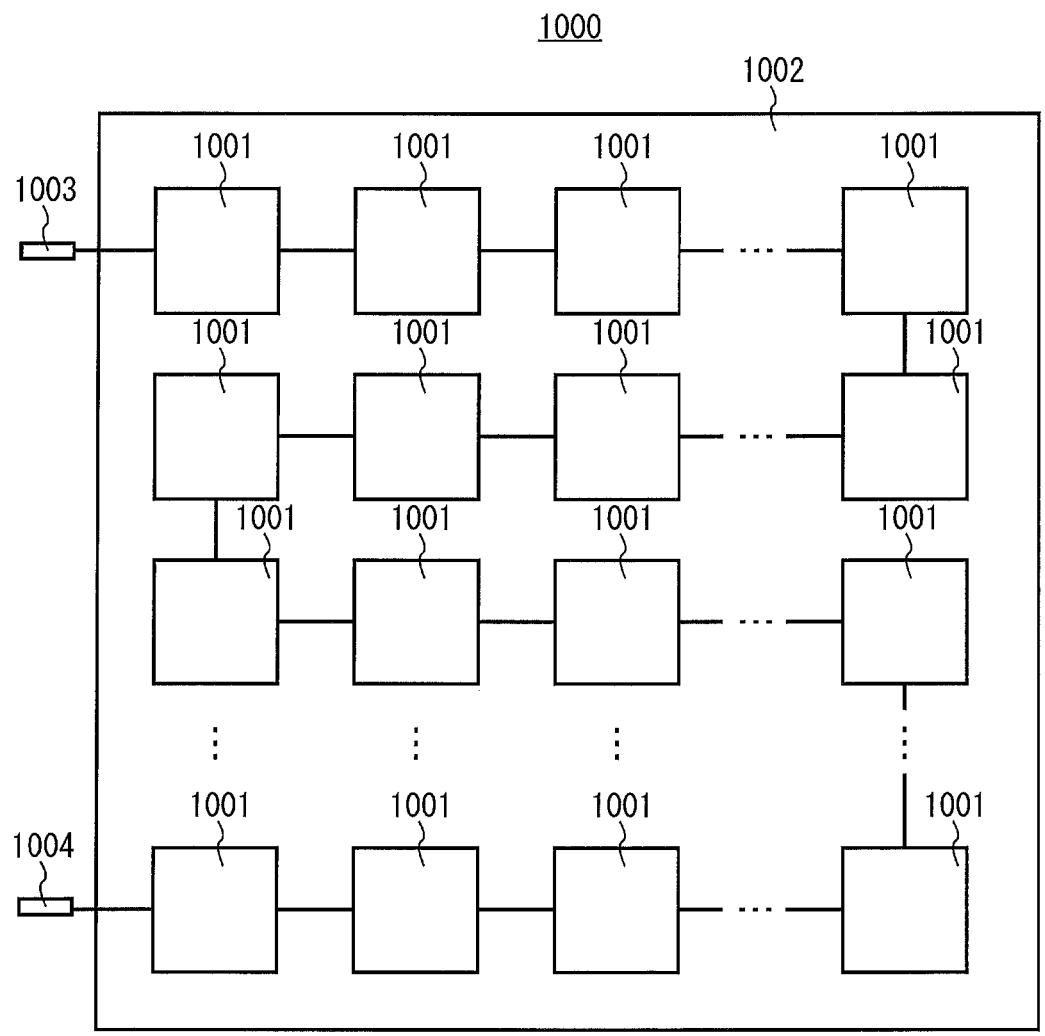

FIG. 21 is a schematic diagram showing a configuration of a photovoltaic module in accordance with a sixth embodiment.

Figure 22A:
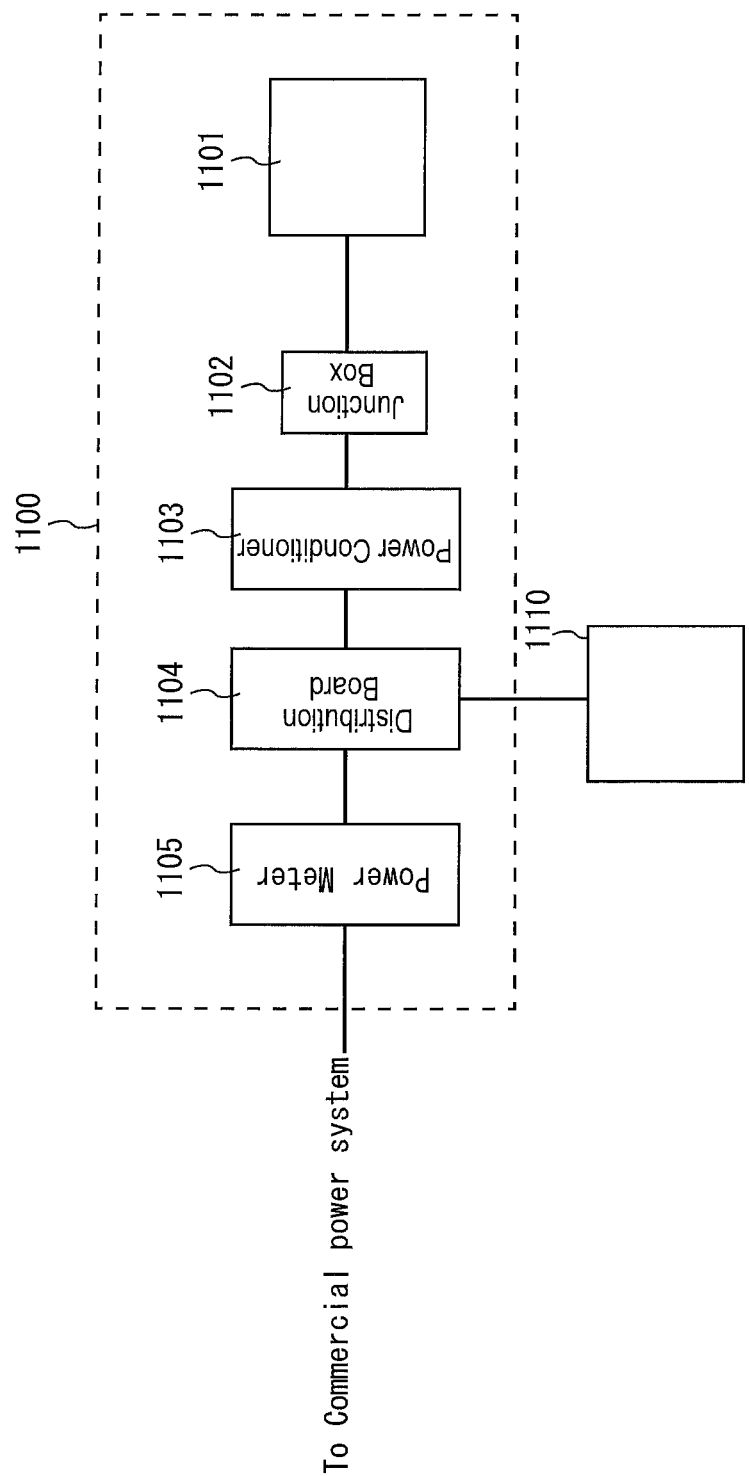

FIG. 22A is a schematic diagram showing a configuration of a solar power generation system including a photovoltaic device in accordance with the sixth embodiment.

Figure 22B:
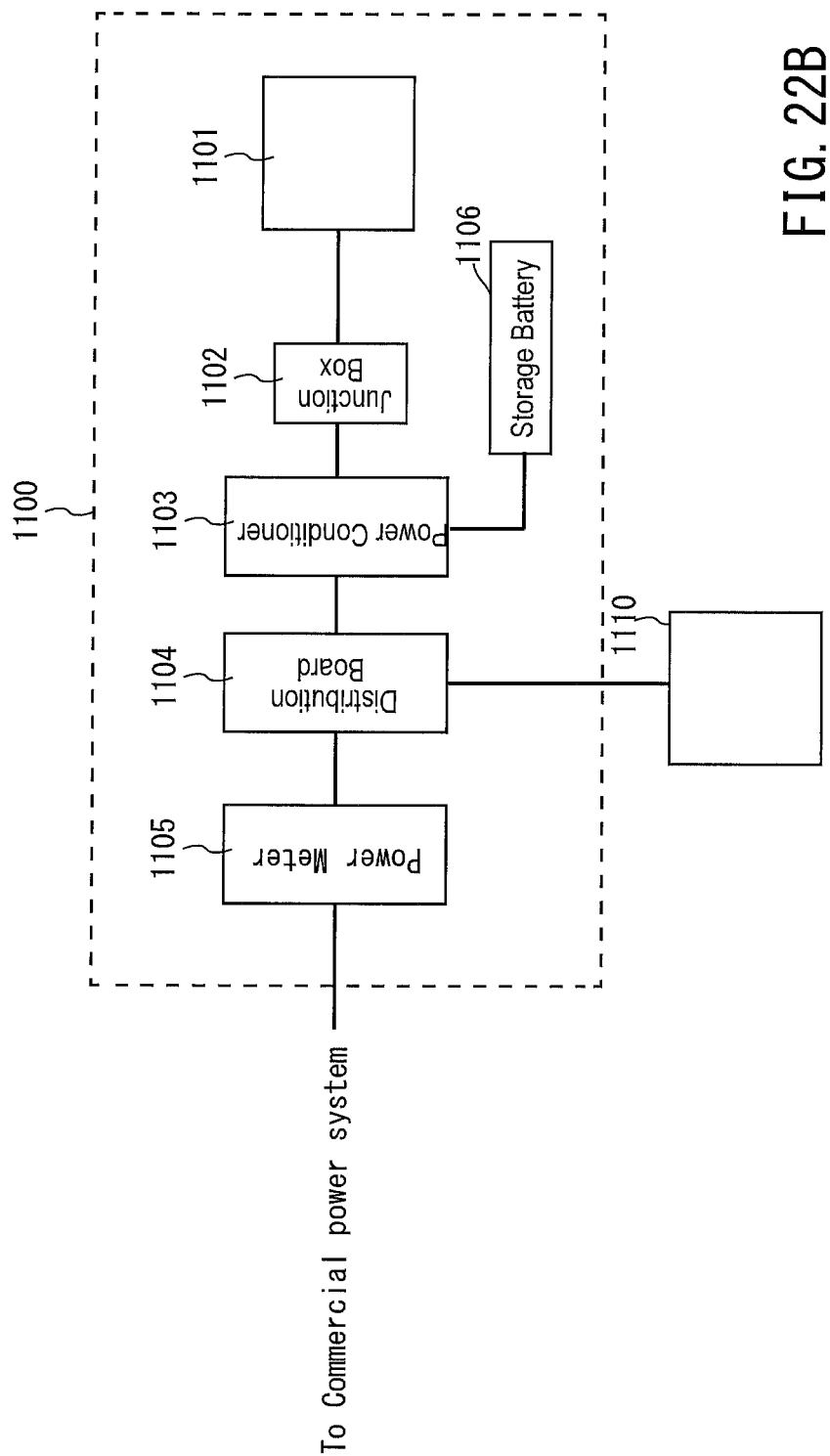

FIG. 22B is a schematic diagram showing another configuration example of the solar power generation system shown in FIG. 22A.

Figure 23:
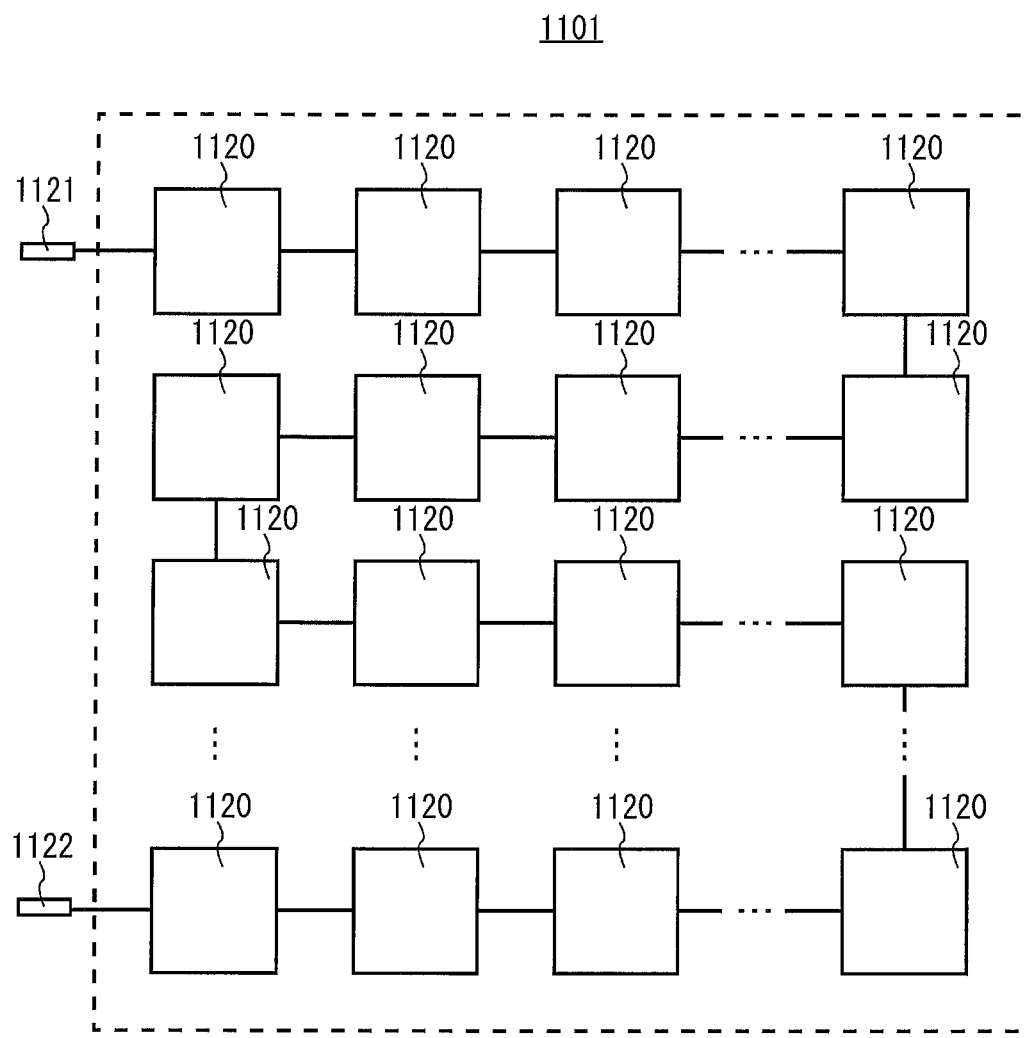

FIG. 23 is a schematic diagram showing a configuration of the photovoltaic module array shown in FIG. 22A.

Figure 24A:
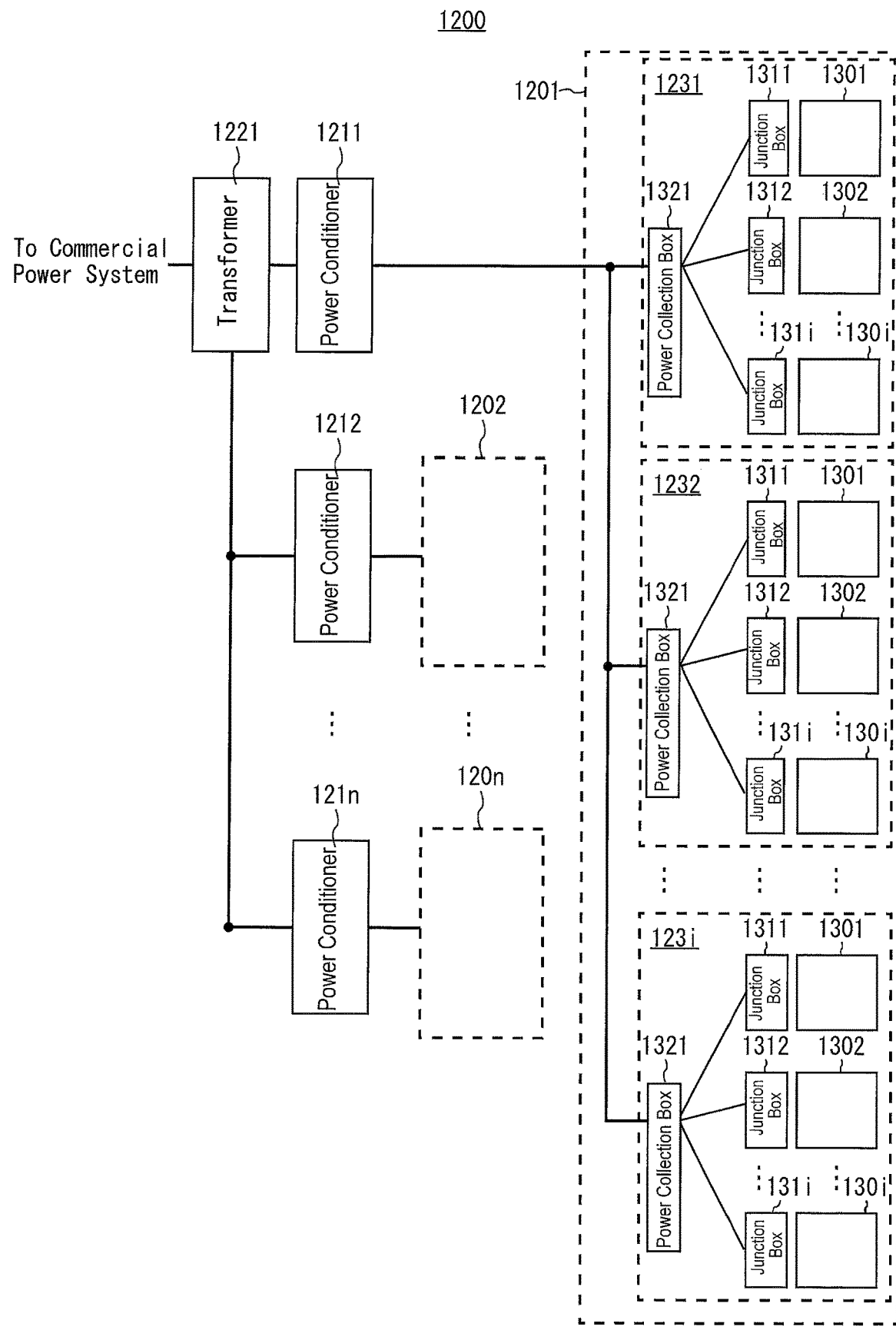

FIG. 24A is a schematic diagram showing a configuration of a solar power generation system including a photovoltaic device in accordance with a seventh embodiment.

Figure 24B:
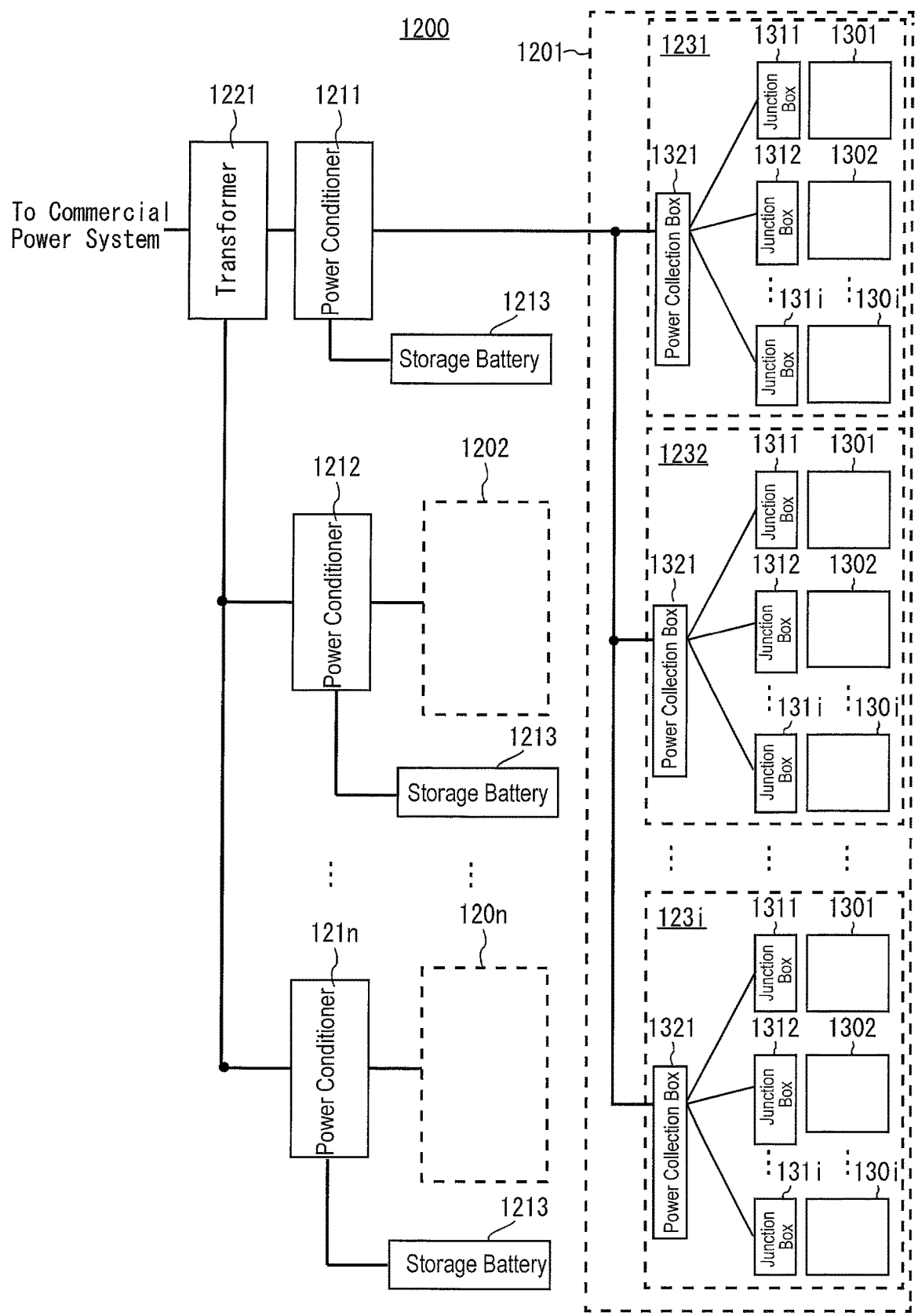

FIG. 24B is a schematic diagram showing another configuration example of the solar power generation system shown in FIG. 24A.

DESCRIPTION OF EMBODIMENTS

The present invention, in one embodiment (or a first aspect) thereof, is directed to a photovoltaic device including: a semiconductor substrate; a first amorphous semiconductor portion on one of faces of the semiconductor substrate, the first amorphous semiconductor portion including at least one first amorphous semiconductor strip of a first conductivity type; a second amorphous semiconductor portion on that face of the semiconductor substrate, adjacent in an in-plane direction of the semiconductor substrate to the first amorphous semiconductor portion, the second amorphous semiconductor portion including at least one second amorphous semiconductor strip of a second conductivity type that differs from the first conductivity type; a plurality of first electrodes spaced apart from each other in the first amorphous semiconductor portion; and a plurality of second electrodes spaced apart from each other in the second amorphous semiconductor portion, wherein the first electrodes are provided on the at least one first amorphous semiconductor strip, and the second electrodes are provided on the at least one second amorphous semiconductor strip.

According to the first aspect, there are provided a first amorphous semiconductor portion and a second amorphous semiconductor portion adjacent to each other in an in-plane direction on one of faces of a substrate. The first amorphous semiconductor portion and the second amorphous semiconductor portion include at least one first amorphous semiconductor strip and at least one second amorphous semiconductor strip respectively. There is provided a plurality of first electrodes spaced apart from each other in the first amorphous semiconductor portion, and there is provided a plurality of second electrodes spaced apart from each other in the second amorphous semiconductor portion. The first electrodes are provided on the at least one first amorphous semiconductor strip, and the second electrodes are provided on the at least one second amorphous semiconductor strip. Therefore, inter-electrode regions are formed between adjacent first electrodes on the first amorphous semiconductor strip and between adjacent second electrodes on the second amorphous semiconductor strip. These inter-electrode regions reduce the stress caused by the weight of the first and second electrodes and the internal stress of these electrodes, thereby restraining the semiconductor substrate from warping and bending under the stress exerted by the electrodes.

In a second aspect, the photovoltaic device of the first aspect may be configured such that: the at least one first amorphous semiconductor strip includes a plurality of first amorphous semiconductor strips spaced apart from each other, and at least one of the first electrodes is provided on each of the first amorphous semiconductor strips in the first amorphous semiconductor portion; and the at least one second amorphous semiconductor strip includes a plurality of second amorphous semiconductor strips spaced apart from each other, and at least one of the second electrodes is provided on each of the second amorphous semiconductor strips in the second amorphous semiconductor portion.

According to the second aspect, the first amorphous semiconductor portion includes a plurality of first amorphous semiconductor strips formed spaced apart from each other, and the second amorphous semiconductor portion includes a plurality of second amorphous semiconductor strips formed spaced apart from each other. Therefore, the semiconductor substrate is better restrained from warping and bending under the stress of the first and second amorphous semiconductor strips than in a structure where the first and second amorphous semiconductor strips are formed continuously as respective single pieces.

In a third aspect, the photovoltaic device of the first aspect may be configured such that: at least either the first amorphous semiconductor portion or the second amorphous semiconductor portion includes at least one first groove region extending in the in-plane direction on the at least one first amorphous semiconductor strip or the at least one second amorphous semiconductor strip in that amorphous semiconductor portion; and at least one of the first electrodes or the second electrodes is provided on top of each of regions of the amorphous semiconductor portion that are adjacent to each other across the first groove region.

According to the third aspect, the semiconductor strip in at least either the first amorphous semiconductor portion or the second amorphous semiconductor portion includes a first groove region. Therefore, the semiconductor strip has a smaller thickness in the first groove region than in the regions other than the first groove region. This structure hence alleviates the stress of the semiconductor strip, thereby reducing the warping and bending of the semiconductor substrate under the stress of the semiconductor strip. Additionally, since the semiconductor strip has a smaller thickness in the first groove region than in the other regions, the semiconductor strip has a higher dopant concentration in the first groove region than in the other regions. As a result, the semiconductor strip has an increased conductivity, thereby improving collection efficiency for the carriers produced in the first groove region of the semiconductor strip.

In a fourth aspect, the photovoltaic device of the third aspect may further include an intrinsic amorphous semiconductor layer between the face of the semiconductor substrate and the first amorphous semiconductor portion and between the face of the semiconductor substrate and the second amorphous semiconductor portion, wherein the intrinsic amorphous semiconductor layer includes a second groove region in a location corresponding to the first groove region.

According to the fourth aspect, the intrinsic amorphous semiconductor layer includes a second groove region in a location corresponding to the first groove region. Therefore, the intrinsic amorphous semiconductor layer has a smaller thickness in the second groove region on one of faces of the semiconductor substrate than in a structure in which the intrinsic amorphous semiconductor layer includes no second groove region. Hence, the intrinsic amorphous semiconductor layer produces less stress, thereby further reducing the stress exerted on the semiconductor substrate.

In a fifth aspect, the photovoltaic device of any one of the first to fourth aspects may be configured such that either each of the first electrodes is separated by a distance of less than or equal to 500 μm from each adjacent one of the first electrodes or each of the second electrodes is separated by a distance of less than or equal to 500 μm from each adjacent one of the second electrodes.

The fifth aspect improves collection efficiency for carriers produced in inter-electrode regions between adjacent first electrodes in the first amorphous semiconductor portion and between adjacent second electrodes in the second amorphous semiconductor.

In a sixth aspect, the photovoltaic device of any one of the first to fifth aspects may be configured such that: the semiconductor substrate is of the first conductivity type; and the first electrodes in the first amorphous semiconductor portion outnumber the second electrodes in the second amorphous semiconductor portion.

The sixth aspect both suppresses disappearance of carriers and restrains the semiconductor substrate from warping and bending under the stress of the electrodes.

In a seventh aspect, the photovoltaic device of any one of the first to sixth aspects may be configured such that either: at least either the first amorphous semiconductor strip or the second amorphous semiconductor strip has a length in an arrangement direction of the first or second electrodes that is not more than 300 times a length of that strip in a direction perpendicular to the arrangement direction; or at least either the first electrodes or the second electrodes have a length in the arrangement direction that is not more than 300 times a length of those electrodes in the direction perpendicular to the arrangement direction.

The seventh aspect alleviates stress on the semiconductor substrate, thereby restraining the semiconductor substrate from warping and bending.

The following will describe embodiments of the photovoltaic device of the present invention in detail in reference to drawings. Throughout the present specification, the "photovoltaic device" collectively refers to the photovoltaic element, the photovoltaic module built around a photovoltaic element, and the solar-cell power generation system including a photovoltaic module. Identical or equivalent members in the drawings will be denoted by the same reference signs, and description thereof is not repeated. For clarity purposes, the drawings to which reference will be made in the following description may show structures in a simplified or schematic form or omit some structural members. The relative dimensions of the structural members as shown in the drawings may not represent actual relative dimensions thereof.

First Embodiment

Figure 2:
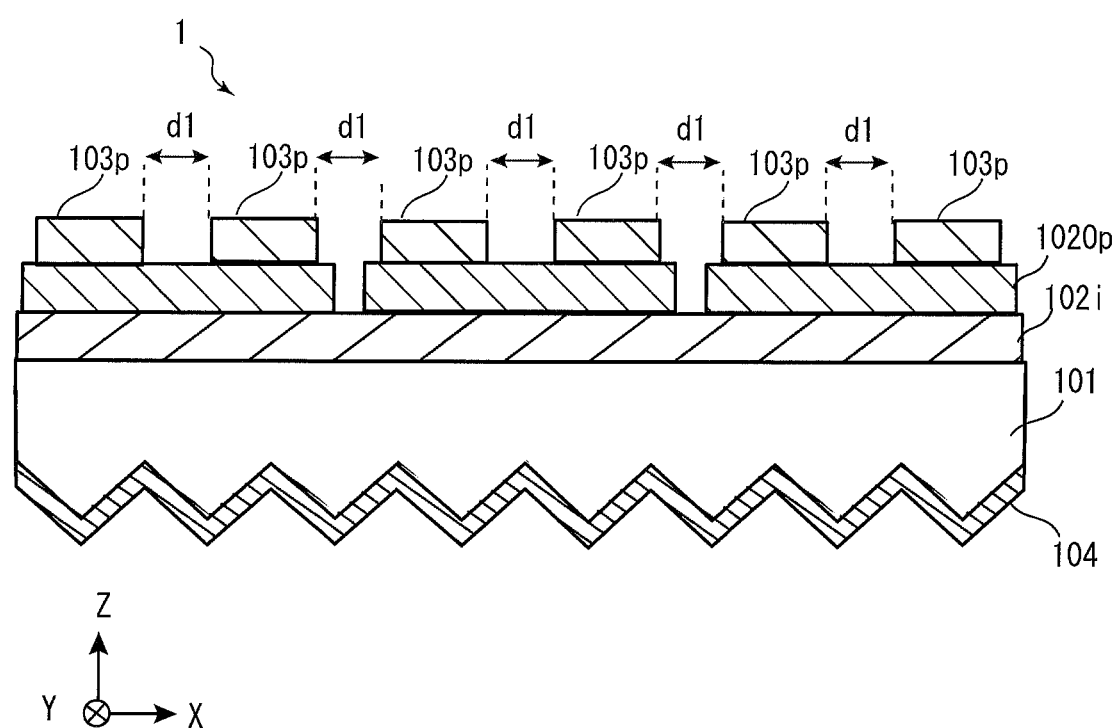
FIG. 2 is a schematic A-A cross-sectional view of the photovoltaic device shown in FIG. 1.

FIG. 1 is a schematic plan view of a photovoltaic device in accordance with a first embodiment of the present invention. FIG. 2 is a schematic A-A cross-sectional view of a photovoltaic device 1 shown in FIG. 1.

Referring to FIGS. 1 and 2, the photovoltaic device 1 includes a silicon substrate 101, an i-type amorphous silicon layer 102$i$, n-type amorphous semiconductor sections 102$n$, p-type amorphous semiconductor sections 102$p$, electrodes 103, and an antireflective film 104.

The silicon substrate 101 is, for example, an n-type monocrystal silicon substrate. The silicon substrate 101 has a thickness of 100 to 150 μm, for example.

Referring to FIG. 2, the antireflective film 104 is formed to cover one of faces of the silicon substrate 101 (negative along the Z-axis). The antireflective film 104 includes, for example, an approximately 20-nm thick silicon oxide film and an approximately 60-nm thick silicon nitride film, deposited in this order. The antireflective film 104 reduces the surface reflectance of the silicon substrate 101 and increases short-circuit currents in the silicon substrate 101. Throughout the following description, the face on which the antireflective film 104 is formed will be referred to as the light-receiving face, and the other face (positive along the Z-axis) will be referred to as the back face.

On the back face of the silicon substrate 101, the i-type amorphous semiconductor layer 102$i$ is formed. The i-type amorphous semiconductor layer 102$i$ is a film of hydrogen-containing, practically intrinsic amorphous semiconductor. The i-type amorphous semiconductor layer 102$i$ is, for example, composed of i-type amorphous silicon, i-type amorphous silicon germanium, i-type amorphous germanium, i-type amorphous silicon carbide, i-type amorphous silicon nitride, i-type amorphous silicon oxide, or i-type amorphous silicon carbon oxide. The i-type amorphous semiconductor layer 102$i$ has a thickness of 10 nm or less, for example. If the i-type amorphous semiconductor layer 102$i$ has a thickness of less than 10 nm, the i-type amorphous semiconductor layer 102$i$ exhibits reduced passivation characteristics. If the i-type amorphous semiconductor layer 102$i$ is too thick, the i-type amorphous semiconductor layer 102$i$ exhibits excessive serial resistance. Taking passivation characteristics and serial resistance into consideration, the i-type amorphous semiconductor layer 102$i$ preferably has a thickness of 10 nm or less.

The p-type amorphous semiconductor sections 102$p$ and the n-type amorphous semiconductor sections 102$n$ are formed on the i-type amorphous semiconductor layer 102$i$. Still referring to FIG. 1, the p-type amorphous semiconductor sections 102$p$ and the n-type amorphous semiconductor sections 102n are provided alternately as viewed in the Y-axis direction on the silicon substrate 101.

As shown in FIG. 1, each p-type amorphous semiconductor section 102p includes three generally rectangular p-type amorphous semiconductor strips 1020p, whereas each n-type amorphous semiconductor section 102n includes four generally rectangular n-type amorphous semiconductor strips 1020n. Each p-type amorphous semiconductor section 102 and each n-type amorphous semiconductor section 102n only need to include at least one p-type amorphous semiconductor strip 1020p and at least one n-type amorphous semiconductor strip 1020n respectively, and may include any number of p-type amorphous semiconductor strips 1020p (except zero) and any number of n-type amorphous semiconductor strips 1020n (except zero) respectively.

As shown in FIG. 1, on the silicon substrate 101, the three p-type amorphous semiconductor strips 1020p are spaced apart from each other in the X-axis direction, and so are the four n-type amorphous semiconductor strips 1020n. In addition, the gaps between the n-type amorphous semiconductor strips 1020n are out of alignment in the X-axis direction with the gaps between the p-type amorphous semiconductor strips 1020p. In this example, the gap distance between the adjacent n-type amorphous semiconductor strips 1020n and the gap distance between the adjacent p-type amorphous semiconductor strips 1020p are approximately 2 mm or less, which is shorter than the diffusion length (e.g., approximately 2 mm) of carriers (i.e., electrons or holes) produced in the silicon substrate 101. Thus, this structure restricts recombination of carriers, thereby collecting carriers efficiently.

Each n-type amorphous semiconductor strip 1020n is a hydrogen-containing, n-type amorphous semiconductor strip and may be n-type amorphous silicon, n-type amorphous silicon germanium, n-type amorphous germanium, n-type amorphous silicon carbide, n-type amorphous silicon nitride, n-type amorphous silicon oxide, n-type amorphous silicon oxynitride, or n-type amorphous silicon carbon oxide, containing, for example, phosphorus (P) as an impurity. The n-type amorphous semiconductor strip 1020n has a thickness of 5 to 20 nm, for example.

Each p-type amorphous semiconductor strip 1020p is a hydrogen-containing, p-type amorphous semiconductor strip and may be p-type amorphous silicon, p-type amorphous silicon germanium, p-type amorphous germanium, p-type amorphous silicon carbide, p-type amorphous silicon nitride, p-type amorphous silicon oxide, p-type amorphous silicon oxynitride, or p-type amorphous silicon carbon oxide, containing, for example, boron (B) as an impurity. The p-type amorphous semiconductor strip 1020p has a thickness of 5 to 20 nm, for example.

As used herein, amorphous semiconductor also means a semiconductor containing a microcrystalline phase. The microcrystalline phase contains crystals with an average particle diameter of 1 to 50 nm.

The electrodes 103, generally rectangular in shape, are formed on the p-type amorphous semiconductor strips 1020p and the n-type amorphous semiconductor strips 1020n as shown in FIGS. 1 and 2. Throughout the following description, those electrodes 103 which are formed on the p-type amorphous semiconductor strips 102p and those electrodes 103 which are formed on the n-type amorphous semiconductor strips 102n will be, where necessary, distinguished by referring to them as the p-type electrodes 103p and the n-type electrodes 103n respectively.

In the present embodiment, the p-type electrodes 103p are provided on the p-type amorphous semiconductor strips 1020p such that the number of p-type electrodes 103p in each p-type amorphous semiconductor section 102p is more than or equal to the number of p-type amorphous semiconductor strips 1020p in that p-type amorphous semiconductor section 102p.

Likewise, the n-type electrodes 103n are provided on the n-type amorphous semiconductor strips 1020n such that the number of n-type electrodes 103n in each n-type amorphous semiconductor section 102n is more than or equal to the number of n-type amorphous semiconductor strips 1020n in that n-type amorphous semiconductor section 102n.

In other words, in the example shown in FIG. 1, there are provided two p-type electrodes 103p on each of the three p-type amorphous semiconductor strips 1020p in each p-type amorphous semiconductor section 102p, which means that the number of p-type electrodes 103p in each p-type amorphous semiconductor section 102p is more than or equal to the number of p-type amorphous semiconductor strips 1020p in that p-type amorphous semiconductor section 102p. There are also provided one or two n-type electrodes 103n on each of the four n-type amorphous semiconductor strips 1020n in each n-type amorphous semiconductor section 102n, which means that the number of n-type electrodes 103n in each n-type amorphous semiconductor section 102n is more than or equal to the number of n-type amorphous semiconductor strips 1020n in that n-type amorphous semiconductor section 102n.

In this structure, there are formed five inter-electrode regions between the p-type electrodes 103p in each p-type amorphous semiconductor section 102p, and there are formed five inter-electrode regions between the n-type electrodes 103n in each n-type amorphous semiconductor section 102n. Both the stress caused by the weight of the electrodes 103 and the internal stress of the electrodes 103 decrease with an increasing number of these inter-electrode regions. Therefore, this structure restrains the silicon substrate 101 from warping and bending even if the silicon substrate 101 has a thickness of less than or equal to 200 μm.

In addition, in this example, the p-type amorphous semiconductor strips 1020p in each p-type amorphous semiconductor section 102p are spaced apart from each other, and the n-type amorphous semiconductor strips 1020n in each n-type amorphous semiconductor section 102n are spaced apart from each other. The provision of a region between adjacent p-type amorphous semiconductor strips 1020p (hereinafter, will be referred to as a separating region Sp) and a region between adjacent n-type amorphous semiconductor strips 1020n (hereinafter, will be referred to as a separating region Sn) alleviates the stress on the silicon substrate 101 of the p-type amorphous semiconductor strips 1020p and the n-type amorphous semiconductor strips 1020n, thereby further restraining the silicon substrate 101 from warping and bending.

The electrodes 103 are preferably provided on the p-type amorphous semiconductor strips 102p and the n-type amorphous semiconductor strips 102n. If the electrodes 103 are formed in the separating region Sp, the separating region Sn, or the gap region between adjacent p- and n-type amorphous semiconductor sections 102p and 102n, the current, flowing via the i-type amorphous semiconductor layer 102i, that causes leak in p-n junctions increases in these regions.

As shown in FIG. 1, adjacent rows of n-type electrodes 103n and p-type electrodes 103 are separated by a distance L. The p-type electrodes 103p in each p-type amorphous semiconductor section 102p are separated from each other by a distance d1 as shown in FIG. 2. The n-type electrodes 103n in each n-type amorphous semiconductor section 102n are also separated from each other by the distance d1. The distance d1 is preferably less than or equal to approximately 500 µm for reasons detailed later.

The n- and p-type electrodes 103n and 103p are composed of, for example, a metal such as Ag (silver), Ni (nickel), Al (aluminum), Cu (copper), Sn (tin), Pt (platinum), Au (gold), or Ti (titanium), an conductive oxide film such as ITO, an alloy of some or all of these metals, or a stack of films of some or all of these metals. The n- and p-type electrodes 103n and 103p are preferably composed of a high conductivity metal. Each n- and p-type electrode 103n and 103p has a thickness of approximately 50 nm to 1 µm, for example.

In the present embodiment, for example, the p-type amorphous semiconductor strips 1020p may have the cross-sectional structure shown in FIG. 3A, which will be specifically described in the following. Referring to FIG. 3A, each p-type amorphous semiconductor strip 1020p has a flat region FT and reduced thickness regions TD as traced along an in-plane direction (width direction) of the p-type amorphous semiconductor strip 1020p. The flat region FT has a maximum thickness of the p-type amorphous semiconductor strip 1020p, and the thickness of the flat region FT is substantially constant.

Each reduced thickness region TD extends from a point A to a point B as traced along the in-plane direction of the p-type amorphous semiconductor strip 1020p, where the point A is an end of the flat region FT and the point B is a point at which the rate of decrease of the thickness changes from a first rate of decrease to a second rate of decrease that is larger than the first rate of decrease.

The reduced thickness regions TD are located on both sides of the flat region FT as traced along the in-plane direction of the p-type amorphous semiconductor strip 1020p.

The p-type amorphous semiconductor strip 1020p has reduced thickness regions TD because the p-type amorphous semiconductor strip 1020p is formed by plasma CVD using a metal mask as will be described later in detail. The reduced thickness regions TD have a smaller thickness than the flat region FT and for this reason, have a higher dopant concentration than the flat region FT.

The electrode 103p is positioned in contact with the entire flat region FT and portions of the reduced thickness regions TD of the p-type amorphous semiconductor strip 1020p.

FIG. 3A shows the p-type amorphous semiconductor strip 1020p as an example. In the embodiments of the present invention, however, either the p-type amorphous semiconductor strips 1020p or the n-type amorphous semiconductor strips 1020n or both may have reduced thickness regions. If the n-type amorphous semiconductor strip 1020n has the same structure as that shown in FIG. 3A, the n-type electrode 103n is positioned in contact with the entire flat region FT and portions of the reduced thickness regions TD of the n-type amorphous semiconductor strip 1020n.

As a result, the resistance encountered by carriers (i.e., holes) as they move through the p-type amorphous semiconductor strip 1020p to the p-type electrode 103p is smaller than in structures where the p-type amorphous semiconductor strip has a constant thickness as traced along an in-plane direction of the i-type amorphous semiconductor layer 102i. In addition, the resistance encountered by carriers (i.e., electrons) as they move through the n-type amorphous semiconductor strip 1020n to the n-type electrode 103n is smaller than in structures where the n-type amorphous semiconductor strip has a constant thickness as traced along the in-plane direction of the i-type amorphous semiconductor layer 102i. This structure therefore improves the conversion efficiency of the photovoltaic device 1.

Alternatively, the p-type electrode 103p may be in contact with the entire reduced thickness regions TD of the p-type amorphous semiconductor strip 1020p, and the n-type electrode 103n may be in contact with the entire reduced thickness regions TD of the n-type amorphous semiconductor strip 1020n.

Instead of the cross-sectional structure shown in FIG. 3A, the p-type amorphous semiconductor strip 1020p may have, for example, the cross-sectional structure shown in FIG. 3B. Referring to FIG. 3B, the photovoltaic device 1 may include p-type amorphous semiconductor strips 1021p in place of the p-type amorphous semiconductor strips 1020p and p-type electrodes 1031p in place of the p-type electrodes 103p.

Let a point C be a point at which the thickness of the p-type amorphous semiconductor strip 1021p is maximum and a point D be a point at which the rate of decrease of the thickness changes from a first rate of decrease to a second rate of decrease that is larger than the first rate of decrease. Then, the reduced thickness region TD extends from the point C to the point D as traced along an in-plane direction of the p-type amorphous semiconductor strip 1021p.

The p-type amorphous semiconductor strip 1021p has two reduced thickness regions TD as traced along the in-plane direction of the p-type amorphous semiconductor strip 1021p. The two reduced thickness regions TD are positioned in contact with each other in the in-plane direction of the p-type amorphous semiconductor strip 1021p.

Each p-type electrode 1031p is positioned in contact with a portion of one of the two reduced thickness regions TD and a portion of the other reduced thickness region TD.

The photovoltaic device 1 may include, instead of the n-type amorphous semiconductor strips 1020n, n-type amorphous semiconductor strips having the same structure as the p-type amorphous semiconductor strips 1021p shown in FIG. 3B.

In this structure, the resistance encountered by carriers (i.e., holes) as they move through the p-type amorphous semiconductor strip 1021p to the p-type electrode 1031p is smaller than in structures where the p-type amorphous semiconductor strip has a constant thickness as traced along the in-plane direction of the i-type amorphous semiconductor layer 102i. In addition, the resistance encountered by carriers (i.e., electrons) as they move through an n-type amorphous semiconductor strip that has the same structure as the p-type amorphous semiconductor strip 1021p to an n-type electrode is smaller than in structures where the n-type amorphous semiconductor strip has a constant thickness as traced along the in-plane direction of the i-type amorphous semiconductor layer 102i. This structure therefore improves the conversion efficiency of the photovoltaic device 1.

Alternatively, the p-type electrode 1031p may be positioned in contact with the two entire reduced thickness regions TD of the p-type amorphous semiconductor strip 1021p. The same arrangement is also applicable to the n-type amorphous semiconductor strip having the same structure as the p-type amorphous semiconductor strip 1021p.

Alternatively, the p-type amorphous semiconductor strip 1020p may have, for example, the cross-sectional structure shown in FIG. 3C, instead of the cross-sectional structure shown in FIG. 3A. Referring to FIG. 3C, the photovoltaic device 1 may include: p-type amorphous semiconductor strips 1022*p* instead of the p-type amorphous semiconductor strips 1020*p*; and p-type electrodes 1032*p* instead of the p-type electrodes 103*p*.

Let a point E be a point at which the thickness of the p-type amorphous semiconductor strip 1022*p* is maximum, a point F be a point at which the rate of decrease of the thickness changes from a first rate of decrease to a second rate of decrease that is larger than the first rate of decrease, and a point G be a point at which the rate of change of the thickness changes sign from negative to positive. Then, a reduced thickness region TD1 extends from the point E to the point F as traced along an in-plane direction of the p-type amorphous semiconductor strip 1022*p*, and a reduced thickness region TD2 extends from the point E to the point G as traced along the in-plane direction of the p-type amorphous semiconductor strip 1022*p*.

The p-type amorphous semiconductor strip 1022*p* has two reduced thickness regions TD1 and two reduced thickness regions TD2 as traced along the in-plane direction of the p-type amorphous semiconductor strip 1022*p*.

The two reduced thickness regions TD2 are provided such that the thickness distribution is symmetric with respect to a line running through the point G, as viewed along the in-plane direction of the p-type amorphous semiconductor strip 1022*p*. The two reduced thickness regions TD1 are on both sides of the two reduced thickness regions TD2 as traced along the in-plane direction of the p-type amorphous semiconductor strip 1022*p*.

Each p-type electrode 1032*p* is positioned in contact with the two entire reduced thickness regions TD2, a portion of one of the reduced thickness regions TD1, and a portion of the other reduced thickness region TD1.

The photovoltaic device 1 may include, instead of the n-type amorphous semiconductor strips 1020*n*, n-type amorphous semiconductor strips having the same structure as the p-type amorphous semiconductor strips 1022*p* shown in FIG. 3C.

In this structure, the resistance encountered by carriers (i.e., electrons) as they move through the n-type amorphous semiconductor strip to the n-type electrode 103*n* is smaller than in structures where the n-type amorphous semiconductor strip has a constant thickness as traced along the in-plane direction of the i-type amorphous semiconductor layer 102*i*. In addition, the resistance encountered by carriers (i.e., holes) as they move through the p-type amorphous semiconductor strip 1022*p* to the p-type electrode 1032*p* is smaller than in structures where the n-type amorphous semiconductor strip has a constant thickness as traced along the in-plane direction of the i-type amorphous semiconductor layer 102*i*. This structure therefore improves the conversion efficiency of the photovoltaic device 1.

Alternatively, the p-type electrode 1032*p* may be positioned in contact with the two entire reduced thickness regions TD1 and the two entire reduced thickness regions TD2 of the p-type amorphous semiconductor strip 1022*p*. The same arrangement is also applicable to the n-type amorphous semiconductor strip having the same structure as the p-type amorphous semiconductor strip 1022*p*.

Thus, the photovoltaic device 1 includes p-type amorphous semiconductor strips and n-type amorphous semiconductor strips each having reduced thickness regions TD (or TD1 and TD2). In the embodiments of the present invention, the reduced thickness region may be any of the reduced thickness regions TD, TD1, and TD2.

Therefore, the reduced thickness region extends from a first point to a second point as traced along an in-plane direction of the p-type amorphous semiconductor strip or the n-type amorphous semiconductor strip, where the first point is a point at which the p-type amorphous semiconductor strip or the n-type amorphous semiconductor strip has a maximum thickness, and the second point is a point at which the rate of decrease of the thickness changes from a first rate of decrease to a second rate of decrease that is larger than the first rate of decrease or a point at which the rate of change of the thickness changes sign from negative to positive, as traced along the in-plane direction of the p-type amorphous semiconductor strip or the n-type amorphous semiconductor strip.

The above examples describe the silicon substrate 101 as having a flat surface. In reality, however, the face of the silicon substrate 101 that has no texture may in some cases have about 1-μm irregularities produced by etching for removing a damaged layer, for example. A method of measuring the thickness of an amorphous semiconductor layer on an irregular surface of the silicon substrate 101 will be described next.

On a silicon substrate 101 with irregularities on its surface is formed an i-type amorphous semiconductor layer 102*i*, after which n-type amorphous semiconductor strips 1020*n* or p-type amorphous semiconductor strips 1020*p* having reduced thickness regions are formed on the i-type amorphous semiconductor layer 102*i*. Then, a picture is taken of a cross-section of the silicon substrate 101 by scanning electron microscopy (SEM) or transmission electron microscopy (TEM). An interface between the i-type amorphous semiconductor layer 102*i* and the silicon substrate 101 can be readily observed in this picture. Portion (a) of FIG. 3D is a schematic diagram representing results of measurement of a distance (thickness h) from the interface S between the i-type amorphous semiconductor layer 102*i* and the surface of the silicon substrate 101 to the surface of the n-type amorphous semiconductor strip 1020*n* or the p-type amorphous semiconductor strip 1020*p*. Portion (b) of FIG. 3D is obtained by re-plotting the values of the thickness h shown in (a) of FIG. 3D. Using (b) of FIG. 3D, the thickness of the amorphous semiconductor layer (i.e., n-type amorphous semiconductor strip or p-type amorphous semiconductor strip) can be determined assuming that the surface of the silicon substrate 101 is generally flat.

Where both faces of the silicon substrate 101 have a texture, the thickness of the structure on the texture may be measured and its values be re-plotted in a manner similar to that described above, to evaluate reduced thickness regions.

The face of a silicon wafer that has no texture has a difference in height of approximately 2 μm at most; this difference is still very small compared with the difference on the face with a texture (several tens of micrometers at most), and the face can safely be considered flat.

Thus, taking into consideration the easiness with which contacts can be made to external wiring such as a wiring sheet detailed later and the difficulty with which a short circuit can occur between the electrodes 103, normally, the i-type amorphous semiconductor layer 102*i*, the n-type amorphous semiconductor strips 1020*n*, and the p-type amorphous semiconductor strips 1020*p*, for example, would preferably be formed on the back face (i.e., face without a texture) which is relatively flat. However, to trap incident light efficiently in the silicon substrate 101, the back face of the silicon substrate 101 preferably has a texture, and if the back face of the silicon substrate 101 has a texture, the surface area of the silicon substrate 101 increases (by about 1.7 times), thereby reducing contact resistance. Furthermore, if only one face of the silicon substrate 101 is to have a texture, anisotropic etching needs to include a step for protecting the face that is not to have a texture. On the other hand, if both faces of the silicon substrate 101 are to have a texture, none of the faces of the silicon substrate 101 needs to be protected, thereby reducing the number of steps in the process.

Next will be described how photovoltaic devices 1 are combined into a module. When photovoltaic devices 1 are combined into a module, each photovoltaic device 1 is electrically connected to an external wiring circuit (hereinafter, will be referred to as a wiring sheet). FIG. 4 is an enlarged schematic view of a portion of a wiring sheet of the present embodiment.

A wiring sheet 300 includes an insulating substrate 301 on which a wiring member 302n for use with n-type members and a wiring member 302p for use with p-type members are provided.

The insulating substrate 301 may be made of any insulating material, such as polyethylene terephthalate (PET), polyethylene naphthalate (PEN), polyphenylene sulfide (PPS), polyvinyl fluoride (PVF), or polyimide. The thickness of the insulating substrate 301 is by no means limited to any particular value, and is preferably not smaller than about 25 µm and not larger than about 150 µm. The insulating substrate 301 may have a single-layer structure or a multi-layer structure with two or more layers.

The wiring members 302n and 302p are comb-shaped and have teeth disposed alternately and spaced apart by a predetermined distance. The n- and p-type electrodes 103n and 103p on the back face of the photovoltaic device 1 are joined to the wiring members 302n and 302p respectively. Connection wiring (not shown) is provided on the surface of the insulating substrate 301. The wiring members 302n and 302p of adjacent photovoltaic devices 1 are electrically connected via the connection wiring, and these adjacent photovoltaic devices 1 on the wiring sheet 300 are also electrically connected to each other via the connection wiring. Thus, electric current produced as light enters the light-receiving face of the photovoltaic device 1 can be taken out toward the outside via the wiring members 302p and 302n.

The wiring members 302n and 302p may be made of any conductive material, including a metal such as Cu, Al, or Ag or an alloy mainly composed of some or all of these metals.

The thickness of the wiring members 302n and 302p is by no means limited to any particular value and is preferably not smaller than 10 µm and not larger than 100 µm, for example. If the thickness of the wiring members 302n and 302p is smaller than 10 µm, the wiring resistance could be excessively high. If the thickness is larger than 100 µm, heat needs to be applied when the wiring members 302n and 302p are attached to the photovoltaic device 1. As such, for a thickness in excess of 100 µm, for example, differences between the thermal expansion coefficient of the silicon substrate 101 of the photovoltaic device 1 and those of the wiring members 302n and 302p cause the wiring sheet 300 to warp significantly. In view of this, the thickness of the wiring members 302n and 302p is more preferably not larger than 100 µm.

Furthermore, a conductive material such as nickel, gold, platinum, palladium, silver, tin, indium, or ITO may be provided on portions of the surfaces of the wiring members 302n and 302p. This arrangement provides good electrical connection between the wiring members 302n and 302p and the n- and p-type electrodes 103n and 103p of the photovoltaic device 1, thereby improving the weather resistance of the wiring members 302n and 302p. The wiring members 302n and 302p may have a single-layer structure or a multi-layer structure with two or more layers.

Now, it will be described more specifically why the distance d1 separating adjacent electrodes 103 is preferably less than or equal to 500 µm.

Portion (a) of FIG. 5A is a diagram representing results of measurement of LBIC (laser beam induced current) in photovoltaic devices with distances d1 between adjacent p-type electrodes 103p of 300 µm and 500 µm, by projecting a laser beam in the X-axis direction onto the photovoltaic devices as shown in (b) of FIG. 5A. In the following, the photovoltaic device with d1=300 µm will be referred to as the photovoltaic device A, and the photovoltaic device with d1=500 µm will be referred to as the photovoltaic device B.

The solid line in (a) of FIG. 5A indicates measurements on the photovoltaic device B, whilst the broken line indicates measurements on the photovoltaic device A. The horizontal axis in (a) of FIG. 5A indicates a position in the X-axis direction in the cross-section of the photovoltaic devices A and B, whilst the vertical axis indicates standardized values (%) of current in inter-electrode regions Dpa and Dpb of the photovoltaic devices A and B, where the current produced in a region of the p-type amorphous semiconductor strip 1020p in which there is provided a p-type electrode 103p in the photovoltaic devices A and B is taken as 100%.

It is understood from the solid and broken lines in (a) of FIG. 5A that less current is produced in the inter-electrode regions Dpa and Dpb. In particular, the current produced in the inter-electrode regions Dpa and Dpb decreases with an increasing distance from the p-type electrode 103p. The current produced in the middle between adjacent p-type electrodes 103p decreases close to approximately 70% in the photovoltaic device B. In the photovoltaic device A, the current produced in the middle between adjacent p-type electrodes 103p decreases close to approximately 80%. The rate of decrease of the current produced in the inter-electrode regions Dpa and Dpb is proportional to the distance from the p-type electrode 103p.

When a laser beam is projected onto a region of the p-type amorphous semiconductor strip 1020p in which there is provided a p-type electrode 103p and another region of the p-type amorphous semiconductor strip 1020p in which there is provided no p-type electrode 103p, substantially equal currents are produced in these regions. However, the carriers produced in the inter-electrode region Dp probably disappear in large proportion before reaching the p-type electrode 103p, which leads to a reduced collection rate of the produced carriers and less current produced in the inter-electrode region Dp.

FIG. 5B represents results of measurement of current produced in the same manner as in the measurement for FIG. 5A, but separately from the measurement for FIG. 5A, by projecting a laser beam onto photovoltaic devices fabricated with various distances d1 of from 200 µm to 700 µm. Each photovoltaic device used here includes p-type amorphous semiconductor strips 1020p each with a length of approximately 30 mm in the X-axis direction and p-type electrodes 103p each with a length of approximately 5 mm in the X-axis direction. FIG. 5B shows standardized sum values of current produced in the p-type amorphous semiconductor strips 1020p each with a length of 30 mm in the X-axis direction in photovoltaic devices, by taking as 100% the sum value of current produced in the p-type amorphous semiconductor strips 1020p each with a length of 30 mm in the X-axis direction in a photovoltaic device with a distance d1 of 500 µm.

It is understood from the current values in FIG. 5B that with a decreasing distance d1, the p-type electrodes 103p take up more of the area on the p-type amorphous semiconductor strips 1020p, and the carriers produced in the inter-electrode region Dp are more likely to be collected. FIG. 5B also suggests that there is a threshold value at distance d1=500 μm; the rates of decrease of the current produced for distances d1 that are longer than 500 μm is larger than the rates of decrease of the current produced for distances d1 that are shorter than 500 μm. In other words, at the distance d1=500 μm, there is an inflection point where the rate of decrease of the current produced changes. The carriers produced disappear in a smaller proportion at distances d1 that are less than or equal to 500 μm than at distances d1 that are more than 500 μm. Therefore, setting the distance d1 to less than or equal to 500 μm allows fewer of the produced carriers to disappear, thereby improving conversion efficiency. More preferably, setting the distance d1 to less than or equal to 400 μm enables even more of the carriers to be collected.

Next will be described an example method of manufacturing the photovoltaic device 1, in reference to FIGS. 6A to 6F.

First, a bulk of silicon is provided, and a wafer with a thickness of 100 to 300 μm is cut out therefrom. The wafer is then etched twice, once to remove the damaged layer on the surface of the wafer and once more to adjust its thickness. A protective film is formed on one side of the etched wafer. The protective film may be, for example, silicon oxide or silicon nitride. The wafer with the protective film is wet-etched using an alkaline solution such as NaOH or KOH (e.g., an aqueous solution containing 1 to 5 wt % KOH and 1 to 10 wt % isopropyl alcohol). At this time, a texture is formed by anisotropic etching on a surface 101a that has no protective film. Removing the protective film after the etching leaves the silicon substrate 101 shown in FIG. 6A.

Next, as shown in FIG. 6B, the antireflective film 104 is provided on the light-receiving face 101a of the silicon substrate 101. The following will describe an antireflective film 104 with a laminate structure with a silicon oxide film and a silicon nitride film stacked on top of each other.

In this implementation, first, the surface of the silicon substrate 101 is subjected to thermal oxidation to form an oxide film on the light-receiving face 101a. Thereafter, a silicon nitride film is formed on the oxide film on the light-receiving face 101a to form the antireflective film 104. The silicon substrate 101 may be oxidized by either wet treatment or thermal oxidation. If wet treatment is used, for example, the silicon substrate 101 is immersed in hydrogen peroxide, nitric acid, or ozonated water and then heated in a dry atmosphere to a temperature ranging from 800 to 1,000° C. If thermal oxidation is used, for example, the silicon substrate 101 is heated in an oxygen or water vapor atmosphere to a temperature ranging from 900 to 1,000° C. The silicon nitride film may be formed by sputtering, electron beam (EB) evaporation, or tetraethoxysilane (TEOS) method. The i-type amorphous semiconductor layer 102i and the n-type amorphous semiconductor strips 1020n may be successively formed between the silicon substrate 101 and the silicon nitride film. In this example, sputtering is performed at low temperature.

Next, on the back face of the silicon substrate 101, i.e. the face opposite the light-receiving face 101a, is formed the i-type amorphous semiconductor layer 102i. The i-type amorphous semiconductor layer 102i may be formed by, for example, plasma chemical vapor deposition (CVD). To form the i-type amorphous semiconductor layer 102i, the reactant gas to be introduced into the reaction chamber of the plasma CVD equipment includes silane gas and hydrogen gas. In this case, for example, the temperature of the silicon substrate 101 may be in the range of 130 to 210° C., the hydrogen gas flow rate may be in the range of 0 to 100 sccm, the silane gas ($SiH_4$) flow rate may be about 40 sccm, the pressure in the reaction chamber may be in the range of 40 to 120 Pa, and the high frequency (13.56 MHz) power density may be in the range of 5 to 15 mW/cm². Thus, the i-type amorphous semiconductor layer 102i is formed on the entire back face of the silicon substrate 101 as shown in FIG. 6C.

Subsequently, a metal mask 500 shown in FIG. 7 is placed on the i-type amorphous semiconductor layer 102i, and the p-type amorphous semiconductor strips 1020p are formed. The metal mask 500 has a plurality of openings 501 for forming the p-type amorphous semiconductor strips 1020p. As shown in FIG. 7, the openings 501 are spaced apart from each other in the X-axis direction and separated by a predetermined distance from each other in the Y-axis direction. The gap distance GA between those openings 501 which are adjacent to each other when viewed along the Y-axis is not larger than about 2 mm.

The diffusion length of carriers (i.e., electrons and holes) produced in the silicon substrate 101 is about 2 mm. Thus, if the gap distance GA between the p-type amorphous semiconductor sections 102p is larger than the diffusion length (approximately 2 mm) of carriers (i.e., electrons and holes), the carriers disappear between the p-type amorphous semiconductor sections 102p, thereby decreasing photoelectric conversion efficiency. However, in the present embodiment, the gap distance GA is not larger than 2 mm such that carriers do not disappear, thereby improving photoelectric conversion efficiency.

The metal mask 500 may be made of a metal such as stainless steel, copper, nickel, an alloy containing nickel (for example, SUS 430, 42 alloy, or invar), or molybdenum. Instead of the metal mask 500, a mask made of glass, ceramics (for example, alumina, zirconia), or an organic film may be used. Alternatively, a mask made by etching a silicon substrate may be used. The thickness of the metal mask 500 is preferably about 50 μm to 300 μm, for example. In this case, the metal mask 500 is unlikely to be bent or caused to float by magnetic force.

When the thermal expansion coefficient and material cost of the silicon substrate 101 are taken into consideration, the metal mask 500 is more preferably a 42 alloy. Regarding the thickness of the metal mask 500, when manufacturing costs are taken into consideration, using the metal mask 500 only once and discarding it would be problematic. Since using the metal mask 500 multiple times reduces running costs of production, it is preferable to recycle the metal mask 500 and use it multiple times. In this case, films formed on the metal mask 500 are removed using hydrofluoric acid or NaOH.

The p-type amorphous semiconductor strips 1020p are formed by plasma CVD, for example. The reactant gas to be introduced into the reaction chamber of the plasma CVD equipment includes silane gas, hydrogen gas, and diborane gas diluted with hydrogen (with a diborane concentration of about 2%, for example). In this case, the hydrogen gas flow rate may be in the range of 0 to 100 sccm, the silane gas flow rate may be 40 sccm, the diborane gas flow rate may be 40 sccm, the temperature of the silicon substrate 101 may be in the range of 150 to 210° C., the pressure in the reaction chamber may be in the range of 40 to 120 Pa, and the high frequency power density may be in the range of 5 to 15 mW/cm². Thus, the p-type amorphous semiconductor strips 1020p doped with boron (B) are formed on the i-type amorphous semiconductor layer 102i as shown in FIG. 6C, being spaced apart from each other in the Y-axis direction. The p-type amorphous semiconductor strips 1020p are also spaced apart from each other in the X-axis direction.

Next, the n-type amorphous semiconductor strips 1020n are formed on the i-type amorphous semiconductor layer 102i as shown in FIG. 6D. The n-type amorphous semiconductor strips 1020n are formed, for example, by plasma CVD using a metal mask 600 shown in FIG. 8 placed on the back face of the semiconductor substrate 101. The metal mask 600 has a plurality of openings 601 for forming the n-type amorphous semiconductor strips 1020n. As shown in FIG. 8, the openings 601 are spaced apart from each other in the X-axis direction and separated by a predetermined distance from each other in the Y-axis direction. The gap distance GB between those openings 601 which are adjacent to each other when viewed along the Y-axis is in the range of approximately 500 to 1,500 µm. The metal mask 600 may be made of a material similar to that for the metal mask 500 and may have a thickness similar to that of the metal mask 500.

The n-type amorphous semiconductor strips 1020n are formed by plasma CVD, for example. The reactant gas to be introduced into the reaction chamber of the plasma CVD equipment includes silane gas, hydrogen gas, and phosphine gas diluted with hydrogen (with a phosphine concentration of 1%, for example). In this case, the temperature of the silicon substrate 101 may be about 170° C., for example, the hydrogen gas flow rate may be in the range of 0 to 100 sccm, the silane gas flow rate may be about 40 sccm, the phosphine gas flow rate may be about 40 sccm, the pressure in the reaction chamber may be about 40 Pa, and the high frequency power density may be about 8.33 mW/cm². Thus, the n-type amorphous semiconductor strips 1020n doped with phosphorus are formed as shown in FIG. 6D, being spaced apart from each other both in the X-axis direction and in the Y-axis direction.

The n-type amorphous semiconductor strips 1020n and the p-type amorphous semiconductor strips 1020p may not overlap each other and may partially overlap each other. If the n- and p-type amorphous semiconductor strips 1020n and 1020p do not overlap, the p- and n-type amorphous semiconductor strips 1020p and 1020n are separated by a distance K as shown in FIG. 6D. The regions between the p- and n-type amorphous semiconductor strips 1020p and 1020n are passivated by the i-type amorphous semiconductor layer 102i such that very few of the carriers produced in the silicon substrate 101 disappear.

If, on the other hand, the n- and p-type amorphous semiconductor strips 1020n and 1020p partially overlap, overlap regions are formed in the p- and n-type amorphous semiconductor strips 1020p and 1020n where these semiconductor strips partially overlap. However, since the conductivity of the p- and n-type amorphous semiconductor strips 1020p and 1020n is low, no current flows between the p- and n-type amorphous semiconductor strips 1020p and 1020n, causing no short circuit in the p-n junction.

Next, after the n-type amorphous semiconductor strips 1020n are formed, the p-type electrodes 103p and the n-type electrodes 103n are formed on the p-type amorphous semiconductor strips 1020p and the n-type amorphous semiconductor strips 1020n respectively as shown in FIG. 6E.

The p- and n-type electrodes 103p and 103n are formed by placing a metal mask 700 shown in FIG. 9 on the silicon substrate 101 and performing deposition or sputtering, for example. The metal mask 700 has a plurality of openings 701n for forming the n-type electrodes 103n and a plurality of openings 701p for forming the p-type electrodes 103p. The openings 701p and 701n have long sides WL each with a length ranging from 5 mm to 40 mm and short sides WC each with a length ranging from 0.3 mm to 2 mm. The gap distance GC1 between those electrodes 103 which are adjacent to each other when viewed along the short side WC, i.e. the gap width L between the p-type electrodes 103p and the n-type electrodes 103n, is approximately 100 to 300 µm.

The thickness of the n- and p-type electrodes 103n and 103p is preferably in the range of 50 nm to 1 µm and more preferably in the range of 50 nm to 500 nm because increased thickness of the electrodes 103 beyond these ranges causes larger stress on the silicon substrate 101, which may cause the silicon substrate 101 to warp. That completes the fabrication of the photovoltaic device 1.

The metal mask 700 may be made of metal, ceramics, glass, or an organic material similarly to the metal mask 500. Depending on the material and processing method used for the metal mask 700, the electrodes 103 formed using the metal mask 700 will in some cases unlikely have cornered shapes like the openings 701p and 701n of the metal mask 700, and may instead have end regions with one of the following shapes.

FIGS. 10A to 10C are schematic top views of the electrodes 103 formed on the p-type amorphous semiconductor strips 1020p or the n-type amorphous semiconductor strips 1020n using the metal mask 700. The end regions of the electrodes 103 shown as an example in FIG. 10A are round in general and formed like arcs projecting outward of the electrodes 103. The end regions of the electrodes 103 shown as an example in FIG. 10B have a concave shape like an arc projecting inward of the electrodes 103. The end regions of the electrodes 103 shown as an example in FIG. 10C have a pointed shape projecting outward of the electrodes 103. In these shapes in FIGS. 10A to 10C, the inter-electrode distance d1 is the distance between tip ends indicated by closed broken lines on the adjacent end regions of the electrodes 103. This inter-electrode distance d1, as shown here, is defined as the shortest distance between the two electrodes 103.

When the metal masks 500, 600, and 700 are used to form the p-type amorphous semiconductor strips 1020p, the n-type amorphous semiconductor strips 1020n, and the electrodes 103, a magnet is used to attach the metal mask to the silicon substrate 101. If the magnet produces an excessively strong magnetic field, the metal mask bends, which renders it difficult to form the p-type amorphous semiconductor strips 1020p, the n-type amorphous semiconductor strips 1020n, and the electrodes 103 in desired shapes.

FIG. 11 is a diagram representing a relationship between the strength of a magnetic field produced by a magnet, the ratio of lengths of the long and short sides (aspect ratio) of the openings of the metal mask, and the amount of bending of the metal mask. In this example, the metal mask is made of a 42 alloy and has a thickness of 300 µm.

A curved line J in FIG. 11 represents a boundary as to whether, when a metal mask having the aspect ratio indicated on the vertical axis is placed on the silicon substrate 101 in a magnetic field with a strength indicated on the horizontal axis, the metal mask can be placed within 10 µm of a predetermined reference position on the silicon substrate 101: the region A that is above or to the right of the curved line J represents a region in which the metal mask cannot be placed in the predetermined range of position, and the region B that is below or to the left of the curved line J represents a region in which the metal mask can be placed in the predetermined range of position. In the region A, the metal mask is excessively influenced by the magnetic field and cannot be placed within the predetermined range of position on the silicon substrate 101 so that the p-type amorphous semiconductor strips, n-type amorphous semiconductor strips, and electrodes cannot be formed in desired shapes. On the other hand, in the region B, the metal mask is relatively mildly influenced by the magnetic field and can be placed within the predetermined range of position on the silicon substrate 101 so that the p-type amorphous semiconductor strips, n-type amorphous semiconductor strips, and electrodes can be formed in desired shapes.

Because it is difficult to control a magnetic field that is weaker than 0.1 mT in placing the metal mask on the silicon substrate 101, it is preferable to use an at least 0.1 mT or stronger magnetic field. However, for mass production of photovoltaic devices, it is more preferable to use an approximately 1.0 mT or stronger magnetic field. Therefore, to obtain a desired shape with some level of precision by using a 0.1 mT or stronger magnetic field, the metal masks 500, 600, and 700 preferably have a 300 or lower aspect ratio as shown in FIG. 11. Therefore, the ratio of lengths of the long and short sides (aspect ratio) of the p-type amorphous semiconductor strips 1020p, the n-type amorphous semiconductor strips 1020n, and the electrodes 103 that are formed by using these metal masks are also 300 or lower.

In the photovoltaic device 1 in accordance with the first embodiment described above, the n-type amorphous semiconductor sections 102n and the p-type amorphous semiconductor sections 102p are provided alternately in an in-plane direction on the i-type amorphous semiconductor layer 102i provided across the entire back face of the silicon substrate 101. The n-type amorphous semiconductor sections 102n include the n-type amorphous semiconductor strips 1020n spaced apart from each other. The p-type amorphous semiconductor sections 102p include the p-type amorphous semiconductor strips 1020p spaced apart from each other. The n-type electrodes 103n and the p-type electrodes 103p are provided in the n-type amorphous semiconductor sections 102n and the p-type amorphous semiconductor sections 102p respectively. A plurality of p-type electrodes 103p are provided on each p-type amorphous semiconductor strip 1020p, and a plurality of n-type electrodes 103n are provided on each n-type amorphous semiconductor strip 1020n. Thus, each p-type amorphous semiconductor strip 1020p has formed thereon an inter-electrode region Dp, and the n-type amorphous semiconductor sections 102n have formed therein inter-electrode regions Dn. The stress caused by the weight of the electrodes 103 and the internal stress of the electrodes 103 are reduced by the presence of the inter-electrode regions Dp and Dn when compared with a structure in which the electrodes are formed continuously on the p-type amorphous semiconductor strips 1020p and the n-type amorphous semiconductor strips 1020n without providing the inter-electrode regions Dp and Dn. Hence, the warping and bending of the silicon substrate 101 are reduced even when the silicon substrate 101 has a thickness of 200 μm or less.

In the p-type amorphous semiconductor sections 102p and the n-type amorphous semiconductor sections 102n, the p-type amorphous semiconductor strips 1020p and the n-type amorphous semiconductor strips 1020n are respectively formed spaced apart from each other. The separating regions Sp and Sn are formed on the silicon substrate 101 between the p-type amorphous semiconductor strips 1020p and between the n-type amorphous semiconductor strips 1020n respectively. The stress caused by the p-type amorphous semiconductor sections 102p and the n-type amorphous semiconductor sections 102n is reduced by the presence of the separating regions Sp and Sn when compared with a structure in which the p-type amorphous semiconductor strips 1020p and the n-type amorphous semiconductor strips 1020n are formed continuously in the p-type amorphous semiconductor sections 102p and the n-type amorphous semiconductor sections 102n respectively without providing the separating regions Sp and Sn on the silicon substrate 101. Hence, the warping and bending of the silicon substrate 101 is further reduced.

In the photovoltaic device 1 in accordance with the first embodiment described above, the inter-electrode distance d1 is less than or equal to 500 μm between adjacent p-type electrodes 103p and between adjacent n-type electrodes 103n. This structure improves collection efficiency for the carriers produced in the inter-electrode regions Dp and Dn, thereby improving conversion efficiency.

The ratio of lengths of the long and short sides (aspect ratio) of the opening regions of the metal masks 500, 600, and 700 used in steps of manufacturing the photovoltaic device 1 in accordance with the first embodiment described above is lower than or equal to 300. Therefore, when these metal masks are attached to the silicon substrate 101 by means of a magnetic field, the metal masks, unlikely to be bent by the magnetic field, are brought into intimate contact with the silicon substrate 101 with some level of precision. As a result, the p-type amorphous semiconductor strips 1020p, the n-type amorphous semiconductor strips 1020n, and the electrodes 103 are formed in desired shapes using the metal masks.

Second Embodiment

FIG. 12A is a schematic plan view of a photovoltaic device in accordance with a second embodiment. FIG. 12B is a schematic C-C cross-sectional view of a photovoltaic device 1A shown in FIG. 12A. The photovoltaic device 1A differs from the photovoltaic device 1 of the first embodiment (see FIG. 1) as in the following.

Referring to FIGS. 12A and 12B, the photovoltaic device 1A includes: p-type amorphous semiconductor sections 112p each including a continuously provided p-type amorphous semiconductor strip 1120p; and n-type amorphous semiconductor sections 112n each including a continuously provided n-type amorphous semiconductor strip 1120n. In other words, the photovoltaic device 1A differs from the photovoltaic device 1 of the first embodiment in that the former has no separating regions Sp or Sn formed on the silicon substrate 101.

The photovoltaic device 1A in accordance with the present embodiment may be manufactured by steps similar to those described in the first embodiment. Different metal masks are used in the steps in FIGS. 6C and 6D here than in the first embodiment. Specifically, in the step of FIG. 6C in which the p-type amorphous semiconductor strips 1120p are formed, a metal mask 510 shown in FIG. 13A is used in place of the metal mask 500. The metal mask 510 has a plurality of openings 511 for forming the p-type amorphous semiconductor strips 1120p. In addition, in the step of FIG. 6D in which the n-type amorphous semiconductor strips 1120n are formed, a metal mask 610 shown in FIG. 13B is used in place of the metal mask 600. The metal mask 610 has a plurality of openings 611 for forming the n-type amorphous semiconductor strips 1120n. In this example, the number of electrodes 103 provided on the p-type amorphous semiconductor strips 1120p and the number of electrodes 103 provided on the n-type amorphous semiconductor strips 1120n are equal to those in the first embodiment. Therefore, the metal mask 700, used in the first embodiment, is also used in the present embodiment. However, a metal mask may generally be used that has openings the number of which matches the number of electrodes 103 provided on the p-type amorphous semiconductor strips 1120p and on the n-type amorphous semiconductor strips 1120n. The openings 511 and 611 of these metal masks 510 and 610 have an aspect ratio (ratio of the long and short sides) of lower than or equal to 300 as is the case with the first embodiment.

The silicon substrate 101 is more likely to receive stress from the n-type amorphous semiconductor sections 112n and the p-type amorphous semiconductor strips 112p in the photovoltaic device 1A than in the photovoltaic device 1. However, in the photovoltaic device 1A, similarly to the first embodiment, a plurality of p-type electrodes 103p is formed on each p-type amorphous semiconductor strip 1120p, and a plurality of n-type electrodes 103n is formed on each n-type amorphous semiconductor strip 1120n. The inter-electrode distance d1 in the photovoltaic device 1A is less than or equal to 500 μm. Therefore, in the photovoltaic device 1A, similarly to the first embodiment, the inter-electrode regions Dp and Dn are provided respectively in the p-type amorphous semiconductor 112p and the n-type amorphous semiconductor sections 112n in numbers that match the number of the electrodes 103. Therefore, the stress caused by the weight of the electrodes 103 and the internal stress of the electrodes 103 are reduced by the presence of the inter-electrode regions Dp and Dn. Hence, the warping and bending of the silicon substrate 101 under the stress of the electrodes 103 is reduced.

The photovoltaic device 1A has no separating regions Sp and Sn and includes either a p- or n-type amorphous semiconductor strip 1120p or 1120n in each inter-electrode region Dp and Dn. Therefore, the passivation characteristics of the silicon substrate 101 are preserved such that the carriers produced in the inter-electrode regions Dp and Dn are unlikely to disappear, which improves conversion efficiency.

Third Embodiment

FIG. 14A is a schematic plan view of a photovoltaic device in accordance with a third embodiment. FIG. 14B is a schematic D-D cross-sectional view of a photovoltaic device 1A shown in FIG. 14A.

Referring to FIG. 14A, the photovoltaic device 1B differs from the photovoltaic device 1A of the second embodiment (FIG. 12A) in the number of the electrodes 103 provided in the p-type amorphous semiconductor sections 112p and the n-type amorphous semiconductor sections 112n.

Specifically, in the photovoltaic device 1B, there are provided more n-type electrodes 103n in the n-type amorphous semiconductor sections 112n than there are provided p-type electrodes 103p in the p-type amorphous semiconductor sections 112p. Therefore, there are more inter-electrode regions Dn in the n-type amorphous semiconductor sections 112n than there are provided inter-electrode regions Dp in the p-type amorphous semiconductor sections 112p. In this example, because the silicon substrate 101 is an n-type monocrystal silicon substrate, the electrons produced by light constitute the majority carriers. Therefore, even in this structure, the influence of the disappearance of carriers is small, and the conversion efficiency is unlikely to decrease.

In addition, the photovoltaic device 1B includes fewer inter-electrode regions Dp in the p-type amorphous semiconductor sections 112p than does the photovoltaic device 1A. The inter-electrode regions Dn in the n-type amorphous semiconductor sections 112n however reduce the stress on the silicon substrate 101 of the electrodes 103, thereby reducing the warping and bending of the silicon substrate 101.

In the step in which the electrodes 103 of the photovoltaic device 1B are formed, a metal mask 710 shown in FIG. 15 is used in place of the metal mask 710. The metal mask 710 has a plurality of openings 711p for forming the p-type electrodes 103p and a plurality of openings 711n for forming the n-type electrodes 103n. The openings 711p and 711n of the metal mask 710 have an aspect ratio (ratio of the long and short sides) of lower than or equal to 300 as is the case with the first embodiment.

Fourth Embodiment

FIG. 16A is a schematic plan view of a photovoltaic device in accordance with a fourth embodiment. FIG. 16B is a schematic E-E cross-sectional view of a photovoltaic device 1C shown in FIG. 16A. Those members in FIGS. 16A and 16B which are equivalent to those in the first embodiment are indicated by the same reference signs or numerals as in the first embodiment. The following description will focus on differences from the first embodiment.

Referring to FIGS. 16A and 16B, the present embodiment differs from the photovoltaic device 1 of the first embodiment in that there are provided groove regions 1221 extending in the Y-axis direction in p-type amorphous semiconductor strips 1220p in p-type amorphous semiconductor sections 122p and in n-type amorphous semiconductor strips 1220n in n-type amorphous semiconductor sections 122n.

As shown in FIG. 16B, the p-type amorphous semiconductor strip 1220p has a thickness T1 in the groove regions 1221 and a thickness T2 in the other regions where there is provided no groove region 1221, the thickness T1 being approximately 50% the thickness T2. Likewise, the n-type amorphous semiconductor strip 1220n, although not shown in FIG. 16B, has a thickness in the groove regions 1221 that is approximately 50% the thickness of the other regions where there is provided no groove region 1221. Since the groove regions 1221 are thinner than the other regions, the stress on the silicon substrate 101 of the p-type amorphous semiconductor strips 1220p and the n-type amorphous semiconductor strips 1220n is reduced when compared with a structure in which the p-type amorphous semiconductor strips 1220p and the n-type amorphous semiconductor strips 1220n are formed continuously without providing the groove regions 1221, which restrains the silicon substrate 101 from warping and bending.

The photovoltaic device 1C in accordance with the present embodiment may be manufactured by steps similar to those described in the first embodiment. The steps shown in FIGS. 6C and 6D in which the p-type amorphous semiconductor strips 1220p and the n-type amorphous semiconductor strips 1220n are formed differ from those in the first embodiment. In the present embodiment, as in the step of FIG. 6C, after the i-type amorphous semiconductor layer 102i is formed, the p-type amorphous semiconductor strips 1220p are formed by plasma CVD using a metal mask 520 shown in (a) of FIG. 17. Portion (b) of FIG. 17 is a schematic F-F cross-sectional view of the metal mask 520.

As shown in (a) and (b) of FIG. 17, the metal mask 520 has opening regions 521 for forming the p-type amorphous semiconductor strips 1220p. Each opening region 521 includes: openings 521a for forming a p-type amorphous semiconductor strip 1220p other than groove regions 1221; and convexities 521b for forming the groove regions 1221.

The convexities 521b are half-etched such that the depth (length in the Z-axis direction) thereof is approximately half the length of the openings 521a in the Z-axis direction. The convexities 521b have a length of not smaller than 200 μm and not greater than 600 μm in the X-axis direction and a length of not smaller than 200 μm and not greater than 1,500 μm in the Y-axis direction.

The convexities 521b, provided in this manner, lower the aspect ratio (ratio of lengths of the long and short sides) of the opening region 521. As a result, the metal mask 520 acquires increased mechanical strength and is restrained from warping even if the metal mask is washed or heated.

In addition, the p-type amorphous semiconductor strips 1220p are formed by plasma CVD, and the reactant gas flows all the way below the half-etched convexities 521b, thereby forming the p-type amorphous semiconductor strips 1220p with a smaller thickness below the convexities 521b than in the openings 521a. The p-type amorphous semiconductor strips 1220p may, depending on the size of the convexities 521b, have a thickness below the convexities 521b that is approximately 30% to 80% the thickness of the p-type amorphous semiconductor strips 1220p in the openings 521a.

The n-type amorphous semiconductor strips 1220n may be formed by plasma CVD using a metal mask having opening regions for forming the n-type amorphous semiconductor strips 1220n, as in the steps in which the p-type amorphous semiconductor strips 1220p are formed. Detailed description of these steps of forming the n-type amorphous semiconductor strips 1220n is not given here. After the n-type amorphous semiconductor strips 1220n are formed, the step described in the first embodiment in reference to FIG. 6E is performed. The photovoltaic device 1C is fabricated in this manner.

In the photovoltaic device 1C, the groove regions 1221 of the p-type amorphous semiconductor strips 1220p have a higher boron concentration than the other regions thereof, and the groove regions 1221 of the n-type amorphous semiconductor strips 1220n have a higher phosphorus concentration than the other regions thereof. In other words, the p- and n-type amorphous semiconductor strips 1220p and 1220n are thinner, but have a higher dopant concentration, in the groove regions 1221 than in the other regions. Therefore, the p- and n-type amorphous semiconductor strips 1220p and 1220n exhibit an increased conductivity along the long sides thereof (i.e., in the X-axis direction), which enables efficient collection of carriers produced in the groove regions 1221.

The fourth embodiment has so far described an example in which the groove regions 1221 are provided both in the p-type amorphous semiconductor strips 1220p and in the n-type amorphous semiconductor strips 1220n. However, the groove regions 1221 only need to be formed at least either in the p-type amorphous semiconductor strips 1220p or in the n-type amorphous semiconductor strips 1220n. This alternative structure also reduces the warping and bending of the silicon substrate 101 because at least either the p-type amorphous semiconductor strips 1220p or the n-type amorphous semiconductor strips 1220n produce less stress.

Fifth Embodiment

FIG. 18A is a schematic plan view of a photovoltaic device in accordance with a fifth embodiment. FIG. 18B is a schematic G-G cross-sectional view of a photovoltaic device 1D shown in FIG. 18A. Those members in FIGS. 18A and 18B which are equivalent to those in the fourth embodiment are indicated by the same reference signs or numerals as in the fourth embodiment. The following description will focus on differences from the fourth embodiment.

Referring to FIG. 18B, the photovoltaic device 1D includes: groove regions 1221 in the p-type amorphous semiconductor strips 1220p and in the n-type amorphous semiconductor strips 1220n similarly to the fourth embodiment; and additional groove regions 1222 extending in the Y-axis direction in an i-type amorphous semiconductor layer 122i in locations corresponding to the groove regions 1221.

Still referring to FIG. 18B, the i-type amorphous semiconductor layer 122i has a thickness M1 in the groove regions 1222 and a thickness M2 in the regions other than the groove regions 1222, the thickness M1 being smaller than the thickness M2. Therefore, the stress on the silicon substrate 101 of the i-type amorphous semiconductor layer 122i is reduced, which further restrains the silicon substrate 101 from warping and bending.

The photovoltaic device 1D in accordance with the present embodiment may be manufactured by steps similar to those described in the first embodiment. The steps shown in FIGS. 6C and 6D in which the i-type amorphous semiconductor layer 122i, the p-type amorphous semiconductor strips 1220p, and the n-type amorphous semiconductor strips 1220n are formed differ from those in the first embodiment. In the present embodiment, following the step in FIG. 6A, the antireflective film 104 is formed on the light-receiving face of the silicon substrate 101 (see FIG. 6B), and the i-type amorphous semiconductor layer 102i is then formed on the back face of the silicon substrate 101 similarly to the first embodiment. After the i-type amorphous semiconductor layer 102i is formed, a resist is applied onto the i-type amorphous semiconductor layer 102i and subjected to patterning. The regions where the groove regions 1222 are to be formed are then half-etched, after which the resist is removed. That completes the formation on the back face of the silicon substrate 101 of the i-type amorphous semiconductor layer 122i with the groove regions 1222 in which the i-type amorphous semiconductor layer 122i has a reduced thickness (see FIG. 19).

After the i-type amorphous semiconductor layer 122i is formed, the metal mask 710 is disposed on the i-type amorphous semiconductor layer 122i, and the p-type amorphous semiconductor strips 1220p are formed by plasma CVD, similarly to the fourth embodiment (see FIG. 20).

After the p-type amorphous semiconductor strips 1220p are formed, the n-type amorphous semiconductor strips 1220n are formed, and the step described in the first embodiment in reference to FIG. 6E is performed, similarly to the fourth embodiment. The photovoltaic device 1D is fabricated in this manner.

In the fifth embodiment, the groove regions 1221 are formed in the p-type amorphous semiconductor strips 1220p and in the n-type amorphous semiconductor strips 1220n, and the groove regions 1222 are additionally formed in the i-type amorphous semiconductor layer 122i. This structure alleviates the stress of the i-type amorphous semiconductor layer 122i as well as the stress of the p-type amorphous semiconductor strips 1220p and the n-type amorphous semiconductor strips 1220n, thereby further restraining the silicon substrate 101 from warping and bending.

The fifth embodiment has so far described an example in which the p-type amorphous semiconductor strips 1220p and the n-type amorphous semiconductor strips 1220*n* have the groove regions 1221 formed therein. However, the groove regions 1221 only need to be formed at least either in the p-type amorphous semiconductor strips 1220*p* or in the n-type amorphous semiconductor strips 1220*n*. When this is actually the case, the groove regions 1222 are formed in the i-type amorphous semiconductor layer 122*i* in locations corresponding to the groove regions 1221 formed in either the p-type amorphous semiconductor strips 1220*p* or the n-type amorphous semiconductor strips 1220*n*. This alternative structure also reduces the warping and bending of the silicon substrate 101 because either the p-type amorphous semiconductor strips 1220*p* or the n-type amorphous semiconductor strips 1220*n* produce less stress, and the i-type amorphous semiconductor layer 122*i* also produces less stress than a structure with no groove regions 1222.

Sixth Embodiment

The present embodiment describes a photovoltaic module including at least a photovoltaic device in accordance with one of the first to fifth embodiments described above. FIG. 21 is a schematic diagram showing a configuration of a photovoltaic module in accordance with a sixth embodiment. A photovoltaic module 1000 includes a plurality of photovoltaic devices 1001, an enclosure 1002, and output terminals 1003 and 1004.

Each photovoltaic device 1001 may be, for example, any one of the photovoltaic devices 1 and 1A to 1D attached to a wiring sheet. Alternatively, an array of such photovoltaic devices connected in series may be provided on a wiring sheet, or instead of being connected in series, such devices may be connected in parallel, or such devices may be connected in series and in parallel.

The enclosure 1002 is composed of a weatherproof enclosure and houses the photovoltaic devices 1001. The enclosure 1002 includes, for example, a transparent base member (e.g., glass) provided to face the light-receiving faces of the photovoltaic devices 1001, a back base member (e.g., glass or resin sheet) provided to face the back faces of the photovoltaic devices 1001, and a sealing member (e.g., EVA) sealing the gaps between the transparent base member and the resin base member.

The output terminal 1003 is connected to one of the photovoltaic devices 1001 connected in series that is located at one end of the series.

The output terminal 1004 is connected to one of the photovoltaic devices 1001 connected in series that is located at the other end of the series.

The photovoltaic module 1000 is by no means limited to this configuration and may have any configuration so long as at least one of the photovoltaic devices 1001 is constituted by one of the photovoltaic devices in accordance with the first to fifth embodiments.

Seventh Embodiment

FIG. 22A is a schematic diagram showing a configuration of a solar power generation system in accordance with a seventh embodiment. A solar power generation system 1100 includes a photovoltaic module array 1101, a junction box 1102, a power conditioner 1103, a distribution board 1104, and a power meter 1105. The solar power generation system 1100 may include an additional function such as "home energy management system (HEMS)" or "building energy management system (BEMS)." This makes it possible to monitor the amount of power produced by the solar power generation system 1100 and to monitor and control the power consumption of electric devices connected to the solar power generation system 1100, thereby reducing energy consumption.

The junction box 1102 is connected to the photovoltaic module array 1101. The power conditioner 1103 is connected to the junction box 1102. The distribution board 1104 is connected to the power conditioner 1103 and an electric device 1110. The power meter 1105 is connected to the distribution board 1104 and a commercial power system.

The photovoltaic module array 1101 converts sunlight to electricity to generate DC power and supplies the generated DC power to the junction box 1102.

The junction box 1102 receives the DC power generated by the photovoltaic module array 1101 and supplies the received DC power to the power conditioner 1103.

The power conditioner 1103 converts the DC power received from the junction box 1102 to AC power and supplies the resulting AC power to the distribution board 1104.

The distribution board 1104 supplies the AC power received from the power conditioner 1103 and/or commercial power received via the power meter 1105 to the electric device 1110. If the AC power received from the power conditioner 1103 is larger than the power consumption of the electric device 1110, the distribution board 1104 supplies the residual AC power to the commercial power system via the power meter 1105.

The power meter 1105 measures the amount of power that is directed from the commercial power system to the distribution board 1104 and measures the amount of power that is directed from the distribution board 1104 to the commercial power system.

FIG. 23 is a schematic diagram showing a configuration of the photovoltaic module array 1101 shown in FIG. 22A. Referring to FIG. 23, the photovoltaic module array 1101 includes a plurality of photovoltaic modules 1120 and output terminals 1121 and 1122.

The photovoltaic modules 1120 form an array and are connected in series. Each photovoltaic module 1120 is constituted by the photovoltaic module 1000 shown in FIG. 21.

The output terminal 1121 is connected to one of the photovoltaic modules 1120 connected in series that is located at one end of the series.

The output terminal 1122 is connected to one of the photovoltaic modules 1120 connected in series that is located at the other end of the series.

The operation of the solar power generation system 1100 will be now described. The photovoltaic module array 1101 converts sunlight to electricity to generate DC power and supplies the generated DC power to the power conditioner 1103 via the junction box 1102.

The power conditioner 1103 converts the DC power received from the photovoltaic module array 1101 to AC power and supplies the resulting AC power to the distribution board 1104.

If the AC power received from the power conditioner 1103 is equal to or larger than the power consumption of the electric device 1110, the distribution board 1104 supplies the AC power received from the power conditioner 1103 to the electric device 1110. Then, the distribution board 1104 supplies the residual AC power to the commercial power system via the power meter 1105.

If the AC power received from the power conditioner 1103 is smaller than the power consumption of the electric device 1110, the distribution board 1104 supplies the AC power received from the commercial power system and the AC power received from the power conditioner 1103 to the electric device 1110.

The solar power generation system in the present embodiment is by no means limited to the configuration shown in FIG. 22A and may have any configuration as far as one of the photovoltaic devices in accordance with the first to fifth embodiments is used. Furthermore, as shown in FIG. 22B, a storage battery 1106 may be connected to the power conditioner 1103. This makes it possible to reduce output variations caused by variations in the amount of solar radiation and to supply power accumulated in the storage battery 1106 during the time periods in which there is no sunshine. The storage battery 1106 may be incorporated in the power conditioner 1103.

Eighth Embodiment

FIG. 24A is a schematic diagram showing a configuration of a solar power generation system in accordance with the eighth embodiment. A solar power generation system 1200 includes subsystems 1201 to 120n (n is an integer larger than 1), power conditioners 1211 to 121n, and a transformer 1221. The solar power generation system 1200 is of a larger scale than the solar power generation system 1100 shown in FIGS. 22A and 22B.

The power conditioners 1211 to 121n are connected to the respective subsystems 1201 to 120n.

The transformer 1221 is connected to the power conditioners 1211 to 121n and a commercial power system.

Each subsystem 1201 to 120n is composed of module systems 1231 to 123j (j is an integer larger than 1).

Each module system 1231 to 123j includes photovoltaic module arrays 1301 to 130i (i is an integer larger than 1), junction boxes 1311 to 131i, and a power collection box 1321.

Each photovoltaic module array 1301 to 130i has the same configuration as the photovoltaic module array 1101 shown in FIG. 22A.

The junction boxes 1311 to 131i are connected to the respective photovoltaic module arrays 1301 to 130i.

The power collection box 1321 is connected to the junction boxes 1311 to 131i. The j power collection boxes 1321 of the subsystem 1201 are connected to the power conditioner 1211. The j power collection boxes 1321 of the subsystem 1202 are connected to the power conditioner 1212. Other power collection boxes are connected to other power conditioners in a similar manner, and the j power collection boxes 1321 of the subsystem 120n are connected to the power conditioner 121n.

The i photovoltaic module arrays 1301 to 130i of the module system 1231 convert sunlight to electricity to generate DC power and supply the generated DC power to the power collection box 1321 via the respective junction boxes 1311 to 131i. The i photovoltaic module arrays 1301 to 130i of the module system 1232 convert sunlight to electricity to generate DC power and supply the generated DC power to the power collection box 1321 via the respective junction boxes 1311 to 131i. Other arrays operate in a similar manner, and the i photovoltaic module arrays 1301 to 130i of the module system 123j convert sunlight to electricity to generate DC power and supply the generated DC power to the power collection box 1321 via the respective junction boxes 1311 to 131i.

Then, the j power collection boxes 1321 of the subsystem 1201 supply their DC power to the power conditioner 1211.

In a similar manner, the j power collection boxes 1321 of the subsystem 1202 supply their DC power to the power conditioner 1212.

Other power collection boxes operate in a similar manner, and the j power collection boxes 1321 of the subsystem 120n supply their DC power to the power conditioner 121n.

The power conditioners 1211 to 121n change the DC power received from the respective subsystems 1201 to 120n to AC power and supply the resulting AC power to the transformer 1221.

The transformer 1221 receives AC power from the power conditioners 1211 to 121n, converts the voltage level of the received AC power, and supplies the resulting power to the commercial power system.

The solar power generation system in the present embodiment is by no means limited to the configuration shown in FIG. 24A and may have any configuration as far as one of the photovoltaic devices in accordance with the first to fifth embodiments is used.

Furthermore, as shown in FIG. 24B, a storage battery 1213 may be connected to each of the power conditioners 1211 to 121n, and each storage battery 1213 may be incorporated in the associated one of the power conditioners 1211 to 121n. In such implementations, each power conditioner 1211 to 121n may convert some or all of the DC power received from its associated power collection boxes 1321 as appropriate and accumulate the resulting power in its associated storage battery 1213. Power accumulated in each storage battery 1213 is supplied to the associated one of the power conditioners 1211 to 121n in accordance with the amount of power generated by the associated one of the subsystems 1201 to 120n, and converted appropriately and supplied to the transformer 1221.

Variation Examples

The photovoltaic devices in accordance with the first to fifth embodiments of the present invention and the photovoltaic modules and solar power generation systems in accordance with the sixth to eighth embodiments incorporating one of the photovoltaic devices in accordance with the first to fifth embodiments have been described. The photovoltaic device of the present invention is by no means limited to the above embodiments, and various modifications are possible within the scope of the invention. In addition, some or all of the embodiments may be combined as necessary.

(1) The first to eighth embodiments above describe an n-type silicon substrate 101 for the photovoltaic device. Alternatively, a p-type silicon substrate 101 may be used.

(2) The first to eighth embodiments above describe, as an example, photovoltaic devices in which the antireflective film 104 is provided on the light-receiving face of the silicon substrate 101. Alternatively, no antireflective film 104 may be provided. As a further alternative, instead of the antireflective film 104, an $n^+$ layer with a high concentration of an n-type dopant diffused therein may be provided. Alternatively, an $n^+$ layer with a high concentration of an n-type dopant diffused therein may be provided between the light-receiving face of the silicon substrate 101 and the antireflective film 104. As a further alternative, the i-type amorphous semiconductor layer 102i and the n-type amorphous semiconductor strips 102n may be successively formed between the silicon substrate 101 and the antireflective film 104.

(3) The first to fifth embodiments above describe, as an example, photovoltaic devices in which an i-type amorphous semiconductor layer is formed on the entire back face of the silicon substrate 101, and then p-type amorphous semiconductor strips are formed on the i-type amorphous semiconductor layer, and then n-type amorphous semiconductor strips are formed; however, the formation of the p- and n-type amorphous semiconductor strips is by no means limited to this order. Alternatively, for example, the i-type amorphous semiconductor layer may be formed, and then the n-type amorphous semiconductor strips may be formed on the i-type amorphous semiconductor layer, and then the p-type amorphous semiconductor strips may be formed on the i-type amorphous semiconductor layer.

(4) The first to eighth embodiments above describe, as an example, that the light-receiving face of the silicon substrate 101 in the photovoltaic device has a texture. Either additionally or alternatively, the back face of the silicon substrate 101 may have a texture formed thereon.

The invention claimed is:

1. A photovoltaic device comprising:
   a semiconductor substrate;
   first amorphous semiconductor strips provided on one of faces of the semiconductor substrate, the first amorphous semiconductor strips having a first conductivity type;
   second amorphous semiconductor strips provided on the one of faces of the semiconductor substrate, the second amorphous semiconductor strips having a second conductivity type that differs from the first conductivity type;
   a plurality of first electrodes including at least two first electrodes provided discontinuously on each of the first amorphous semiconductor strips; and
   a plurality of second electrodes including at least two second electrodes provided discontinuously on each of the second amorphous semiconductor strips,
   wherein the second amorphous semiconductor strips are adjacent, in a first direction in an in-plane direction of the semiconductor substrate, to the first amorphous semiconductor strips, and
   wherein the first amorphous semiconductor strips are spaced apart from each other in a second direction that differs from the first direction, and the second amorphous semiconductor strips are spaced apart from each other in the second direction.

2. The photovoltaic device according to claim 1, wherein either each of the first electrodes is separated by a distance of less than or equal to 500 μm from each adjacent one of the first electrodes or each of the second electrodes is separated by a distance of less than or equal to 500 μm from each adjacent one of the second electrodes.

3. The photovoltaic device according to claim 1, wherein:
   the semiconductor substrate is of the first conductivity type; and
   the first electrodes provided on the first amorphous semiconductor strips outnumber the second electrodes provided on the second amorphous semiconductor strips.

4. The photovoltaic device according to claim 1, wherein either:
   at least either the first amorphous semiconductor strip or the second amorphous semiconductor strip has a length in the second direction that is not more than 300 times a length of that strip in the first direction; or
   at least either the first electrodes or the second electrodes have a length in the second direction that is not more than 300 times a length of those electrodes in the first direction.

* * * * *